US008861280B2

(12) United States Patent
Costa et al.

(10) Patent No.: US 8,861,280 B2
(45) Date of Patent: *Oct. 14, 2014

(54) ERASE FOR 3D NON-VOLATILE MEMORY WITH SEQUENTIAL SELECTION OF WORD LINES

(71) Applicant: SanDisk Technologies Inc., Plano, TX (US)

(72) Inventors: Xiying Costa, San Jose, CA (US); Seung Yu, San Ramon, CA (US); Roy E Scheuerlein, Cupertino, CA (US); Haibo Li, Sunnyvale, CA (US); Man L Mui, Santa Clara, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/279,618

(22) Filed: May 16, 2014

(65) Prior Publication Data
US 2014/0247661 A1 Sep. 4, 2014

Related U.S. Application Data

(63) Continuation of application No. 13/960,360, filed on Aug. 6, 2013.

(60) Provisional application No. 61/682,600, filed on Aug. 13, 2012.

(51) Int. Cl.
*G11C 16/00* (2006.01)
*G11C 16/16* (2006.01)
*G11C 16/24* (2006.01)
*G11C 16/14* (2006.01)

(52) U.S. Cl.
CPC ............... *G11C 16/16* (2013.01); *G11C 16/24* (2013.01); *G11C 16/14* (2013.01)

USPC ............ 365/185.25; 365/185.17; 365/185.18; 365/185.29

(58) Field of Classification Search
CPC ........ G11C 16/10; G11C 16/14; G11C 16/16; G11C 16/24; G11C 16/0483
USPC .............. 365/185.15, 185.17, 185.25, 185.29
See application file for complete search history.

(56) References Cited

U.S. PATENT DOCUMENTS 5,761,122 A 6/1998 Nakamura et al.
6,822,907 B2 11/2004 Maruyama et al.

(Continued)

OTHER PUBLICATIONS

Walker, Andrew J., "The Erase Advantage in DG-TFT-SONOS 3-Dimensional," Schiltron Corporation, Mountain View, CA, May 3010, 7 pages.

(Continued)

*Primary Examiner* — Tan T. Nguyen
(74) *Attorney, Agent, or Firm* — Vierra Magen Marcus LLP

(57) ABSTRACT

An erase operation for a 3D stacked memory device adjusts a start time of an erase period and/or a duration of the erase period for each storage element based on a position of the storage element. A voltage is applied to one or both drive ends of a NAND string to pre-charge a channel to a level which is sufficient to create gate-induced drain leakage at the select gate transistors. With timing based on a storage element's distance from the driven end, the control gate voltage is lowered to encourage tunneling of holes into a charge trapping layer in the erase period. The lowered control gate voltage results in a channel-to-control gate voltage which is sufficiently high to encourage tunneling. The duration of the erase period is also increased when the distance from the driven end is greater. As a result, a narrow erase distribution can be achieved.

30 Claims, 17 Drawing Sheets

(56) References Cited

U.S. PATENT DOCUMENTS

| | | |
|---|---|---|
| 7,009,889 B2 | 3/2006 | Tran et al. |
| 7,430,138 B2 | 9/2008 | Higashitani |
| 7,606,074 B2 | 10/2009 | Wan et al. |
| 7,705,387 B2 | 4/2010 | Ito |
| 7,768,826 B2 | 8/2010 | Ito |
| 8,107,292 B2 | 1/2012 | Maejima |
| 8,163,616 B2 * | 4/2012 | Kang et al. .................. 438/258 |
| 8,199,573 B2 | 6/2012 | Fukuzumi et al. |
| 8,203,187 B2 * | 6/2012 | Lung et al. .................. 257/390 |
| 8,422,299 B2 * | 4/2013 | Iguchi et al. ............. 365/185.18 |
| 8,450,176 B2 * | 5/2013 | Son et al. .................... 438/261 |
| 8,482,051 B2 * | 7/2013 | Lim et al. .................... 257/315 |
| 8,634,246 B2 | 1/2014 | Kang et al. |
| 2010/0054036 A1 | 3/2010 | Lee et al. |
| 2010/0214838 A1 | 8/2010 | Hishida et al. |
| 2013/0279257 A1 * | 10/2013 | Costa et al. .............. 365/185.17 |
| 2014/0043916 A1 | 2/2014 | Costa et al. |

OTHER PUBLICATIONS

Fallah, Farzan, et al., "Standby and Active Leakage Current Control and Minimization in CMOS VLSI Circuits," IEICE Transactions, Jan. 2005, 21 pages.

International Search Report & The Written Opinion of the International Searching Authority dated Oct. 28, 2013, International Application No. PCT/US2013/054232.

Non-final Office Action dated Jun. 17, 2014, U.S. Appl. No. 13/960,360, filed Aug. 6, 2013.

* cited by examiner

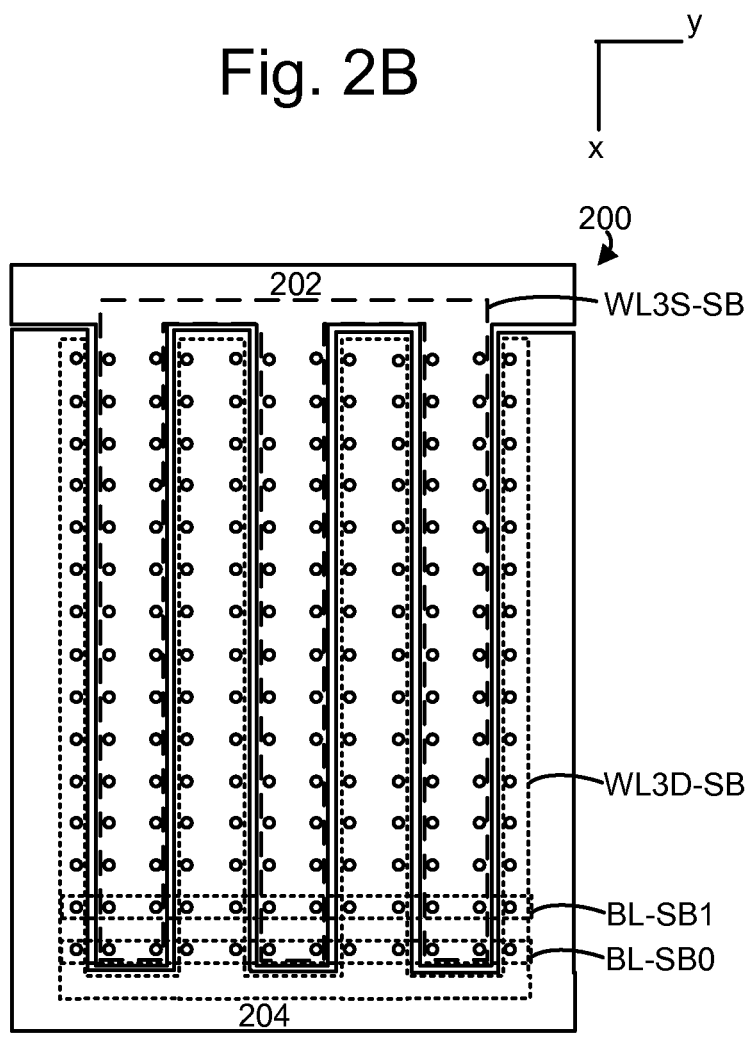

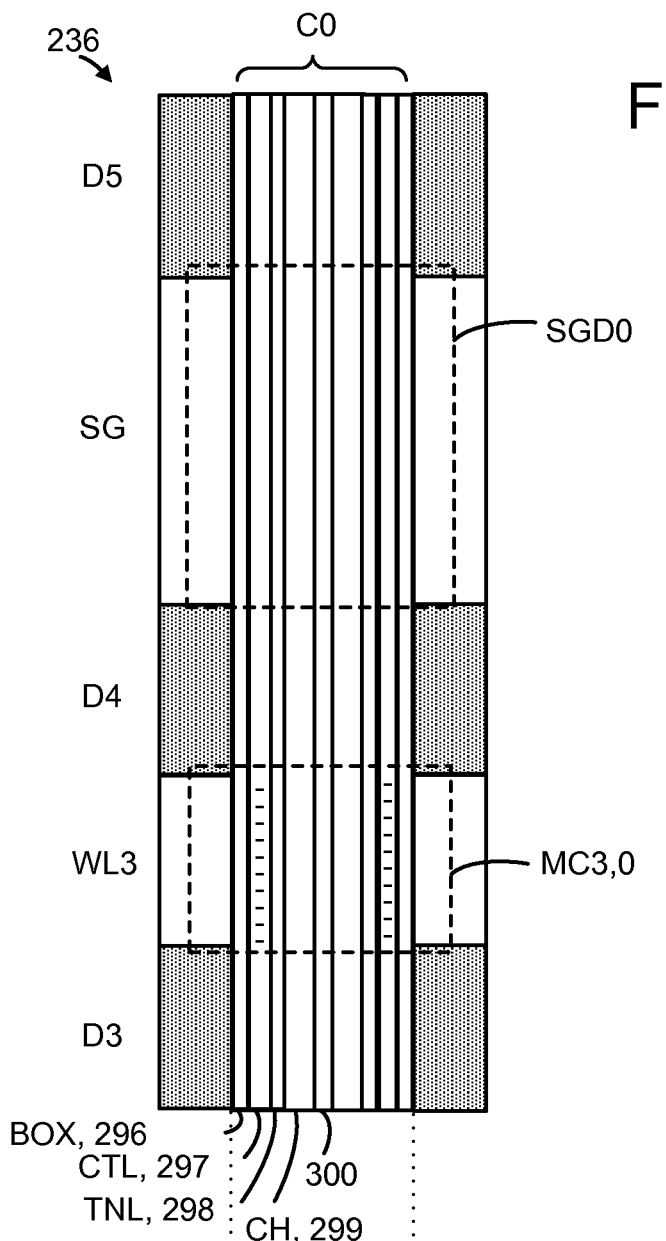
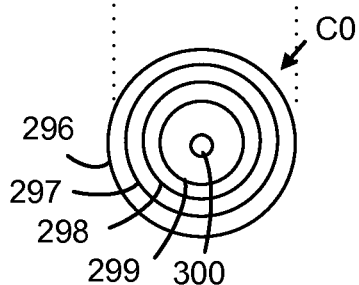
Fig. 3A
Fig. 3B

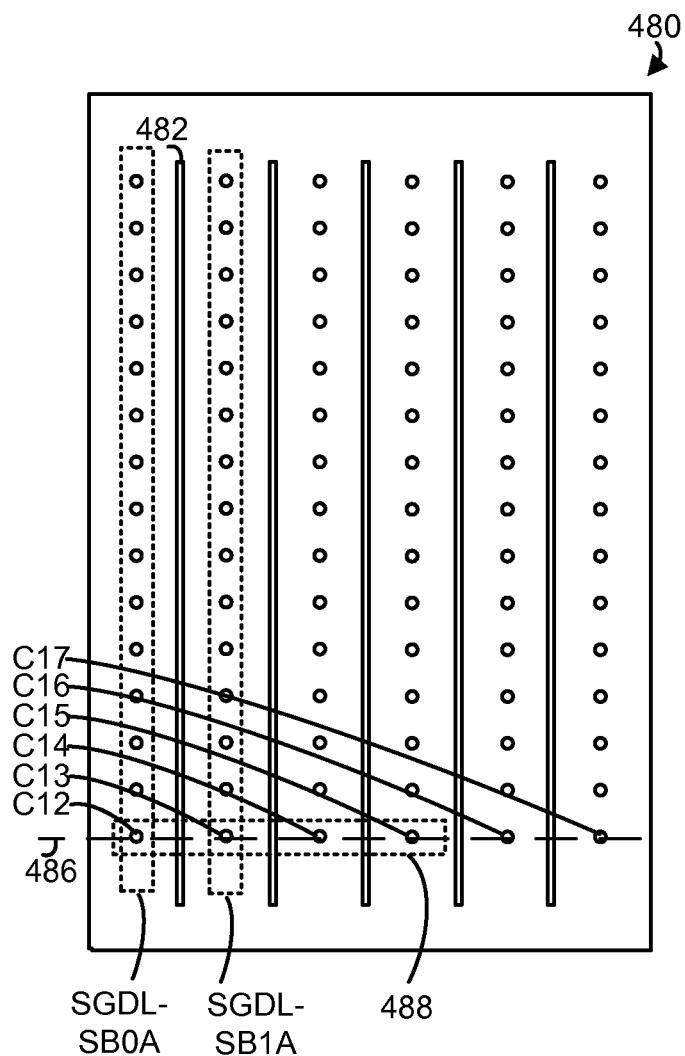

2 sided erase 2 sided erase 2 sided erase

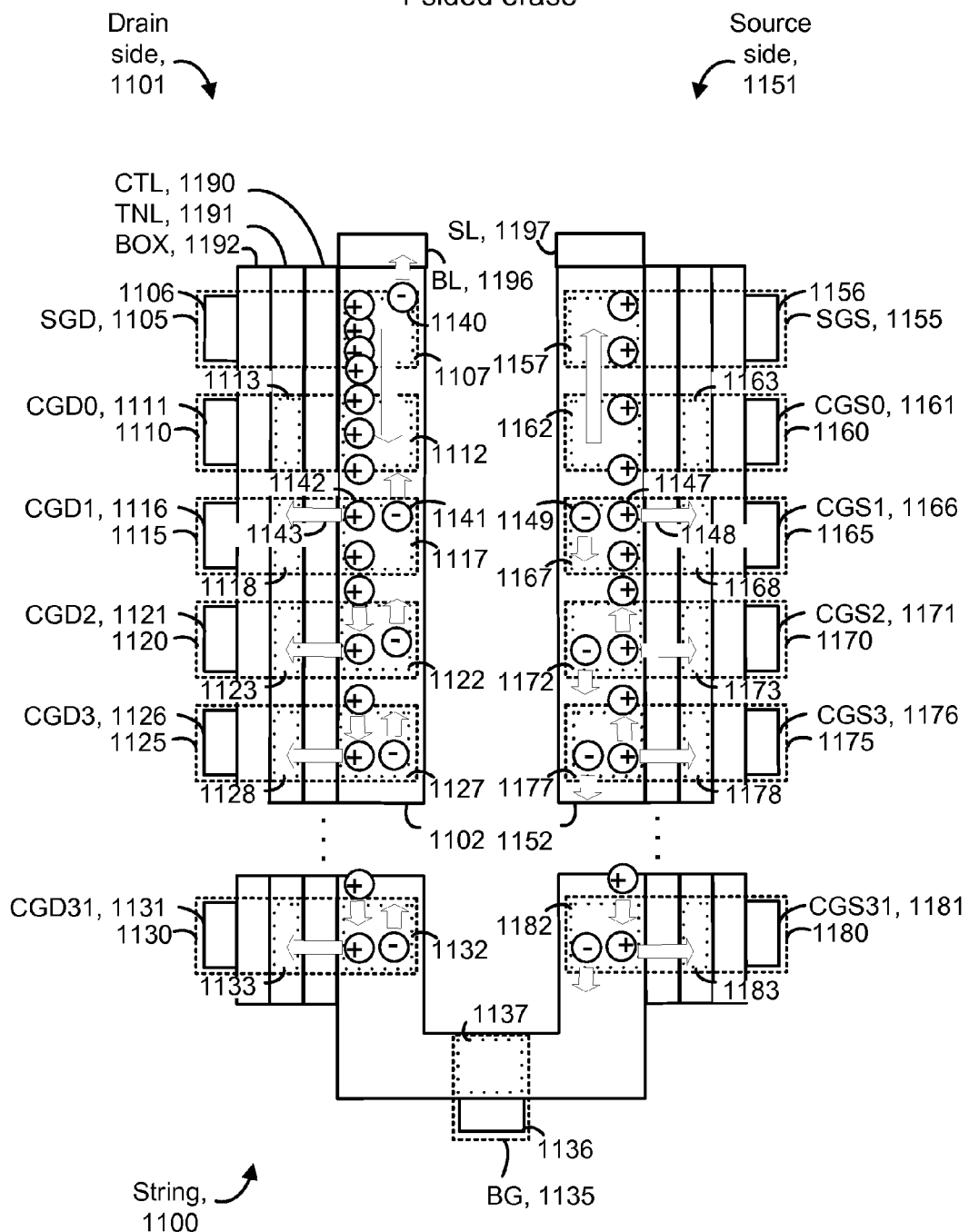

ERASE FOR 3D NON-VOLATILE MEMORY WITH SEQUENTIAL SELECTION OF WORD LINES

CLAIM OF PRIORITY

The present application is a continuation of U.S. patent application Ser. No. 13/960,360, entitled "Erase For 3D Non-Volatile Memory With Sequential Selection Of Word Lines," by Costa et al., filed Aug. 6, 2013 and published as US 2014/0043916 on Feb. 13, 2014, which claims priority from U.S. Provisional Patent Application No. 61/682,600, entitled "Erase For 3D Non-Volatile Memory With Sequential Selection Of Word Lines," by Costa et al., filed Aug. 13, 2012, all of which are incorporated by reference herein in their entirety.

BACKGROUND

The present technology relates to techniques for erasing memory cells in a 3D-non-volatile memory device.

Recently, ultra high density storage devices have been proposed using a 3D stacked memory structure sometimes referred to as a Bit Cost Scalable (BiCS) architecture. For example, a 3D NAND stacked memory device can be formed from an array of alternating conductive and dielectric layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

BRIEF DESCRIPTION OF THE DRAWINGS

Like-numbered elements refer to common components in the different figures.

FIG. 2B depicts the block 200 FIG. 2A, showing example word line subsets WL3D-SB and WL3S-SB and example bit line subsets BL-SB0 and BL-SB1.

FIG. 3A depicts a close-up view of the region 236 of the column C0 of FIG. 2C, showing a drain-side select gate SGD0 and a memory cell MC303.

FIG. 3B depicts a cross-sectional view of the column C0 of FIG. 3A.

FIG. 4A depicts a top view of a straight NAND string embodiment 480 of the block BLK0 of FIG. 1A, showing example SGD line subsets SGDL-SB0A and SGDL-SB1A and example bit line subsets.

FIG. 7A depicts example voltages for a bit line and source line in a two-sided erase, or for a source line in a one-sided erase.

FIG. 7B depicts example voltages for SGD and SGS transistors in a two-sided erase, or for an SGD transistor in a one-sided erase.

FIG. 7C depicts example control gate voltages for control gates which are closest to a driven end of a NAND string.

FIG. 7D depicts example control gate voltages for control gates which are furthest from a driven end of a NAND string.

FIG. 7E depicts a channel voltage 712 in a channel region consistent with FIG. 7C, and a channel voltage 714 in a channel region consistent with FIG. 7D.

FIG. 7F depicts a tunneling voltage 716 in a channel region based on waveform 708 in FIG. 7C subtracted from waveform 712 of FIG. 7E, and a tunneling voltage 718 in a channel region based on waveform 710 in FIG. 7D subtracted from waveform 714 of FIG. 7E.

FIG. 8A depicts a bit line voltage 800.

FIG. 8B depicts a SGS transistor and SGD transistor voltage 802.

FIG. 8C depicts an unselected word line voltage 804 and a selected word line voltage 806.

FIG. 11B depicts the movement of holes and electrons in a U-shaped NAND string during a one-sided erase.

DETAILED DESCRIPTION

Figure 1A:
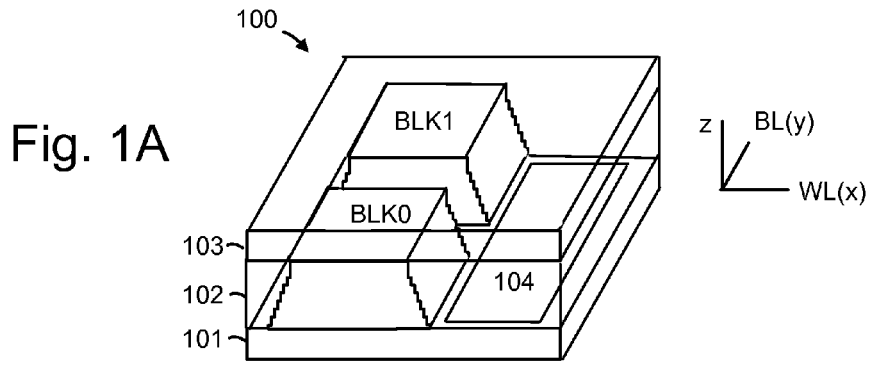
FIG. 1A is a perspective view of a 3D stacked non-volatile memory device.

A 3D stacked non-volatile memory device can be arranged in multiple blocks, where typically an erase operation is performed one block at a time. An erase operation can include multiple erase-verify iterations which are performed until a verify condition is met for the block, at which point the erase operation ends. In one approach, the memory device includes NAND strings which have a drain-side select gate (SGD) transistor on one end and a source-side select gate (SGS) transistor on the other end. The select gate transistors play an important role in an erase operation because they are used to generate a sufficient amount of gate-induced drain leakage (GIDL) current to charge up the floating body of the NAND string in a reasonable time frame. GIDL increases in proportion to the drain-to-gate voltage (Vdg) of the select gate transistors. However, various challenges are encountered during an erase operation.

The erase speed in the memory device is significantly affected by the charging up time which, in turn, is affected by complicated interactions between channel potential, tunneling speed and GIDL current. For example, regions of the channel which are closer to the end of the string are expected to charge up sooner due to GIDL generation at the select gate at the end of the string. Moreover, voltage drops along the channel can occur as tunneling begins. During tunneling, holes from the channel pass through a tunneling layer and travel to a charge trapping layer of the storage elements. The holes recombine with electrons there to reduce the charge in the charge trapping layer, thereby erasing the storage elements. A further complication is that the memory hole in which the channel is formed typically has a cylindrical shape with a smaller diameter at the bottom than the top due to the fabrication process.

A word line sequential selection technique is proposed for block and sub-block erase which can improve erase performance such as by narrowing erase distributions. In one aspect, the erasing of the storage elements in a string is initiated in a sequence, one after another, so that the storage elements are erased in respective shifted erase periods. For example, the erasing can be initiated sooner for storage elements which are closer to a driven end of the string than for storage elements which further from the driven end of the string. This provides sufficient time for different regions of the channel along the string to charge up to a common precharge level. The start times can be incremented by increasing smaller increments for storage elements which are increasingly further from a driven end of the string.

In another aspect, different erase periods are used, so that the erase period is shorter for storage elements which are closer to the driven end of the string than for storage elements which further from the driven end of the string. The two aspects can be combined as well. Various other aspects will be apparent in view of the following discussion. The performance of the word line sequential selection technique is better than other erase techniques such as selective word line erase, in which one word line is erased at a time, and all word line erase, in which all word lines are erased in the same erase period.

The erase technique can be used to erase an entire block of storage elements, or one or more subsets of storage elements in a set of storage elements. For example, the subsets can be groups of storage elements associated with a common bit line, a common SGD line or a common word line. Each subset can be inhibited when it meets a verify condition, such as having no more than a maximum allowable number of fail bits. A fail bit can be a storage element which does not pass a verify test in a given erase-verify iteration, e.g., a memory cell whose Vth is not below Vv_erase.

Advantages include a tightened erase distribution, enhanced erase speed, improved channel potential boosting and improves reliability of the select gate transistor (select device).

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
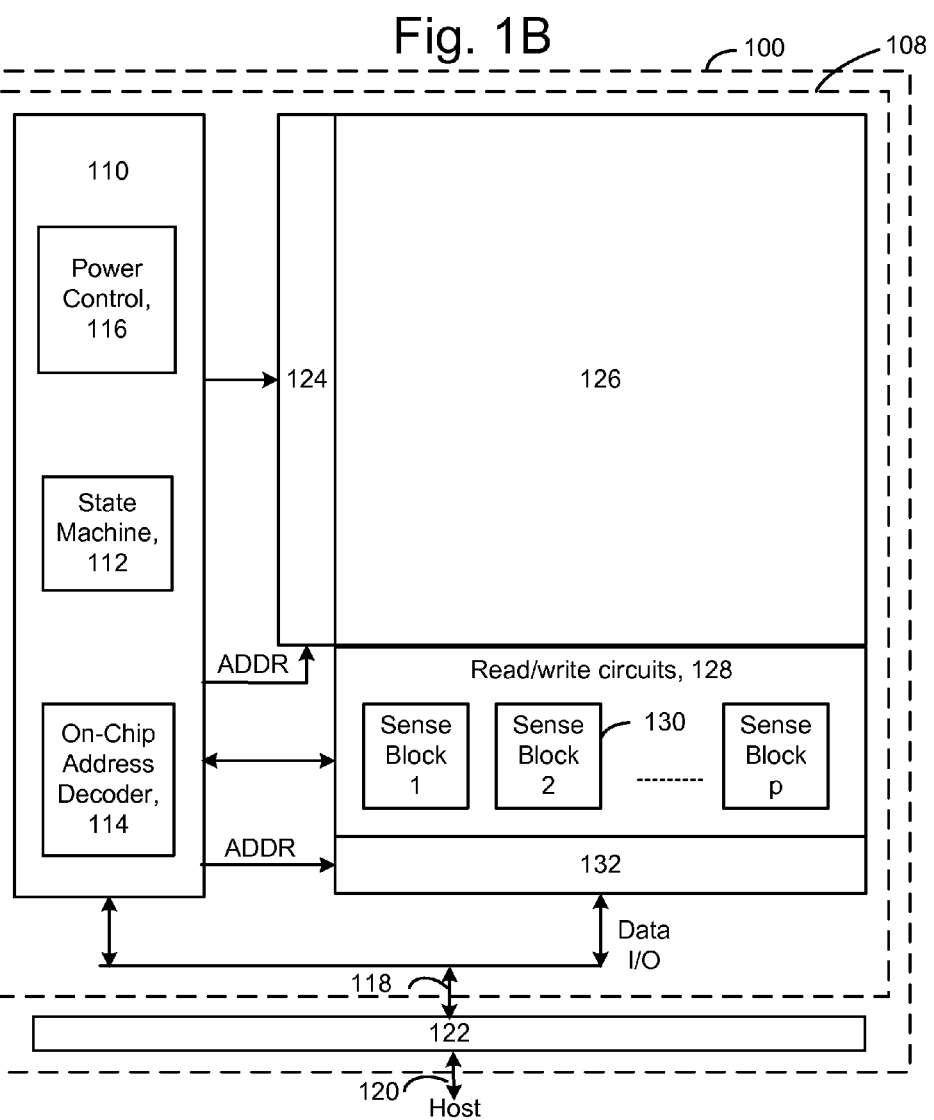
FIG. 1B is a functional block diagram of the 3D stacked non-volatile memory device 100 of FIG. 1A.

FIG. 1B is a functional block diagram of the 3D stacked non-volatile memory device 100 of FIG. 1A. The memory device 100 may include one or more memory die 108. The memory die 108 includes a 3D (three-dimensional) memory array of storage elements 126, e.g., including the blocks BLK0 and BLK1, control circuitry 110, and read/write circuits 128. The memory array 126 is addressable by word lines via a row decoder 124 and by bit lines via a column decoder 132. The read/write circuits 128 include multiple sense blocks 130 (sensing circuitry) and allow a page of storage elements to be read or programmed in parallel. Typically a controller 122 is included in the same memory device 100 (e.g., a removable storage card) as the one or more memory die 108. Commands and data are transferred between the host and controller 122 via lines 120 and between the controller and the one or more memory die 108 via lines 118.

The control circuitry 110 cooperates with the read/write circuits 128 to perform memory operations on the memory array 126, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers and word line layer portions, drain- and source-side select gate drivers (referring, e.g., to drain- and source-sides or ends of a string of memory cells such as a NAND string, for instance) and source lines. The sense blocks 130 can include bit line drivers, in one approach.

In some implementations, some of the components can be combined. In various designs, one or more of the components (alone or in combination), other than memory array 126, can be thought of as at least one control circuit. For example, a control circuit may include any one of, or a combination of, control circuitry 110, state machine 112, decoders 114/132, power control 116, sense blocks 130, read/write circuits 128, and controller 122, and so forth.

In another embodiment, a non-volatile memory system uses dual row/column decoders and read/write circuits. Access to the memory array 126 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 126. In this way, the density of the read/write modules is reduced by one half.

Other types of non-volatile memory in addition to NAND flash memory can also be used.

Figure 2A:
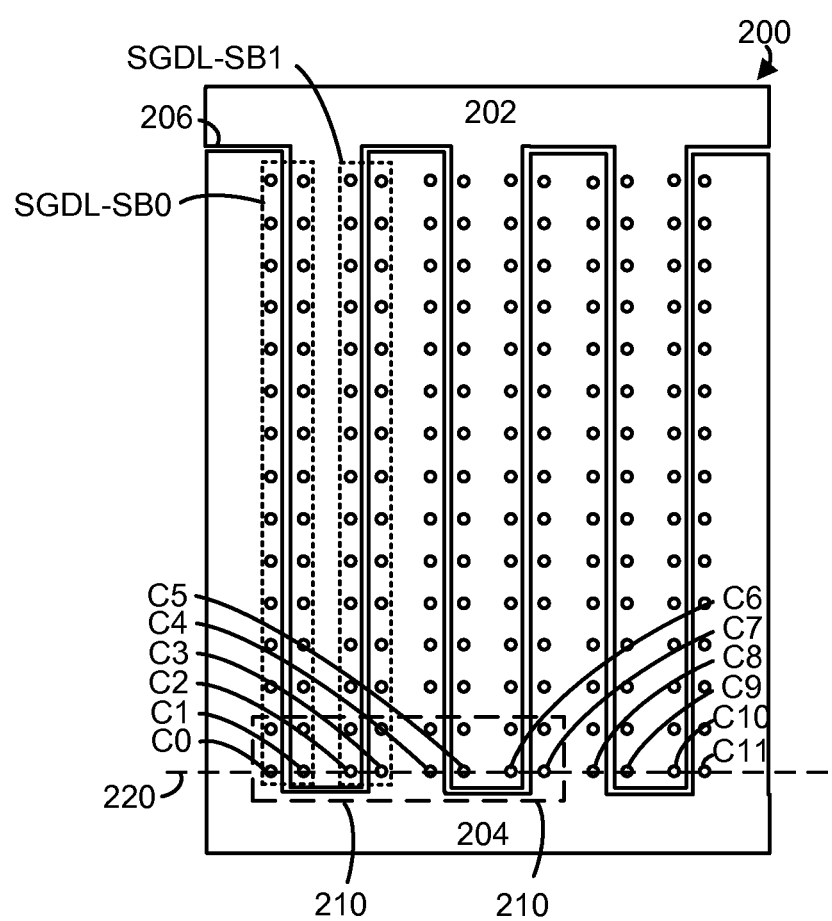
FIG. 2A depicts a top view of a U-shaped NAND embodiment of a block 200, showing example SGD line subsets SGDL-SB0 and SGDL-SB1, as an example implementation of BLK0 in FIG. 1A.
Figure 2C:
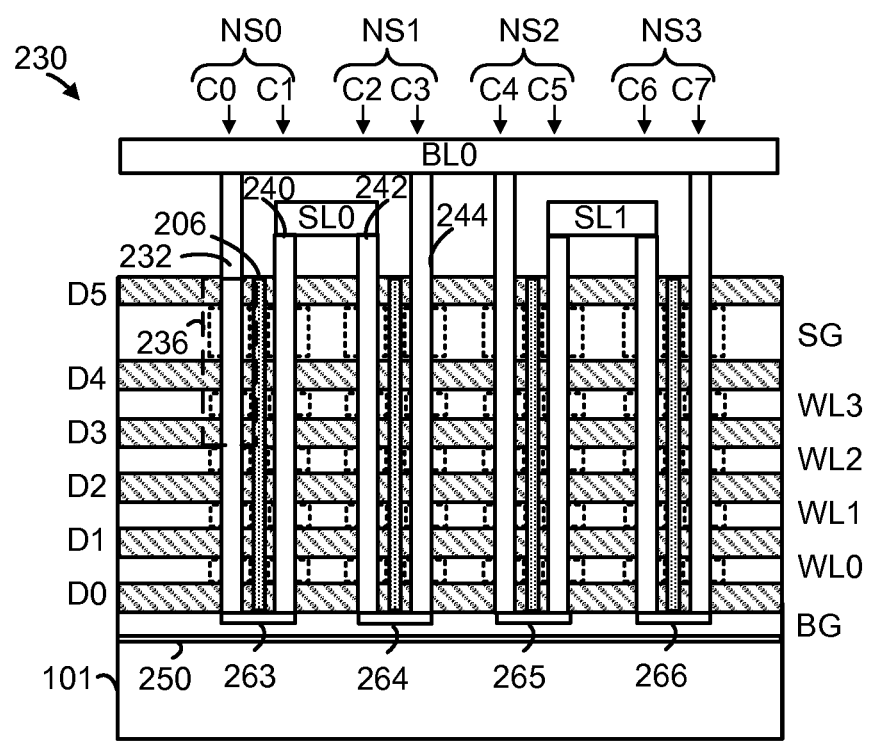
FIG. 2C depicts a cross-sectional view of the portion 210 of the block 200 of FIG. 2A, along line 220.

FIG. 2A depicts a top view of a U-shaped NAND embodiment of a block 200, showing example SGD line subsets SGDL-SB0 and SGDL-SB1, as an example implementation of BLK0 in FIG. 1A. The view is of a representative layer among the multiple word line layers in a stack. Referring also to FIG. 2C, the stack includes alternating dielectric and conductive layers. The dielectric layers include D0 to D5 and may be made of SiO2, for instance. The conductive layers include BG, which is a back gate layer, WL0 to WL3, which form word line layers, e.g., conductive paths to control gates of the memory cells at the layer, and SG, which forms a select gate layer, e.g., a conductive path to control gates of select gate transistors of NAND strings. The word line layer of FIG. 2A may represent any one of WL0 to WL3, for instance. The conductive layers may include doped polysilicon or metal silicide, for instance. An example voltage of 5-10 V may be applied to the back gate to maintain a conductive state which connects the drain- and source-side columns.

For each block, the word line layer is divided into two word line layer portions 202 and 204. Each block includes a slit pattern. A slit refers, e.g., to a void which extends vertically in the stack, typically from an etch stop layer at the bottom to at least a top layer of the stack. The slit can be filled with insulation to insulate words line layer portions from one another. A slit 206 is a single continuous slit which extends in a zig-zag pattern in the block so that the block is divided into two portions, 202 and 204, which are insulated from one another. This approach can provide greater flexibility in controlling the memory cells since the word line layer portions can be driven independently.

Each block includes rows of columnar, e.g., vertical, memory holes or pillars, represented by circles. Each row represents a vertical group of columns in the figure. The memory holes extend vertically in the stack and include memory cells such as in a vertical NAND string. Example columns of memory cells along a line 220 include C0 to C11. The figure represents a simplification, as many more rows of memory holes will typically be used, extending to the right and left in the figure. Also, the figures are not necessarily to scale. The columns of memory cells can be arranged in subsets such as sub-blocks.

Subsets of memory cells can be of different types, such as WL subsets, SGD line subsets and BL subsets.

FIG. 2B depicts the block 200 FIG. 2A, showing example word line subsets WL3D-SB and WL3S-SB and example bit line subsets BL-SB0 and BL-SB1. This example assumes that the WL3 layer is depicted. WL3S-SB is a word line layer or word line layer portion in communication with one (e.g., exactly one) memory cell in the source-side of each U-shaped NAND string, and WL3D-SB is a word line layer or word line layer portion in communication with one (e.g., exactly one) memory cell in the drain-side of each U-shaped NAND string.

Each subset can be independently inhibited from being erased. For example, a WL subset can be independently inhibited from being erased by floating a voltage of the WL. A SGD line subset can be independently inhibited from being erased by setting a voltage of the SGD line to a sufficiently high (but lower than selected BL bias) level which inhibits erase. If Vdg is small enough not to be able to generate GIDL to charge the unselected channels, the unselected SGD line subset can be inhibited from being erased. Similarly, a BL subset can be independently inhibited from being erased by setting a voltage of the BL to a sufficiently low level which inhibits erase. The term "inhibit erase" or the like refers, e.g., to substantially preventing or not encouraging erase. A "subset" as used herein generally refers to a proper subset. A subset "A" is a proper subset of a set "B" when $A \subset B$ and $A \neq B$. That is, A contains one or more cells which are also contained within B, but A does not contain all cells in B. A contains fewer memory cells than B. Subsets of the same type typically are distinct from one another and do not contain common cells. Subsets of different types can contain one or more common cells.

When U-shaped NAND strings are used, each SGD line subset can include two adjacent rows of columns of memory cells. In a subset, the adjacent rows are separated by the slit. The columns of memory cells on one side of the slit are drain-side columns (e.g., C0, C3, C4 and C7 in FIG. 2C) of NAND strings, and the columns of memory cells on the other side of the slit are source-side columns (e.g., C1, C2, C5 and C6 in FIG. 2C) of the NAND strings. Note that the pattern of two source-side columns between two drain-side columns repeats in the y-direction.

Word line drivers can independently provide signals such as voltage waveforms to the word line layer portions 202 and 204.

The drawings are not to scale and do not show all memory columns. For example, a more realistic block might have 12 memory columns in the y direction as shown, but a very large number such as 32 k memory columns in the x direction, for a total of 384 k memory columns in a block. With U-shaped NAND strings, 192 k NAND strings are provided in this example. With straight NAND strings, 384 k NAND strings are provided in this example. Assume there are four memory cells per column, so there are 384 k×4=1,536 k or 1,536,000 total cells in the set.

A portion 210 of the block 200 is described further below in connection with FIG. 3A.

FIG. 2C depicts a cross-sectional view of the portion 210 of the block 200 of FIG. 2A, along line 220. Columns of memory cells C0 to C7 are depicted in the multi-layer stack. The stack 230 includes the substrate 101, an insulating film 250 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 263 to 266 which connect the columns. The back gate thus connects the two columns of each U-shaped NAND string. For example, NS0 (NS=NAND string) includes columns C0 and C1 and connecting portion 263. NS0 has a drain end 232 and a source end 240. NS1 includes columns C2 and C3 and connecting portion 264. NS1 has a drain end 244 and a source end 242. NS2 includes columns C4 and C5 and connecting portion 265. NS3 includes columns C6 and C7 and connecting portion 266.

The source line SL0 is connected to the source ends 240 and 242 of two adjacent memory strings NS0 and NS1. The source line SL0 is also connected to other sets of memory strings which are behind NS0 and NS1 in the x direction. Recall that additional U-shaped NAND strings in the stack 230 extend behind the U-shaped NAND strings depicted in the cross-section, e.g., along the x-axis, in a SGD line direction. The U-shaped NAND strings NS0 to NS3 are each in a different SGD line subset, but are in a common BL subset.

The slit portion 206 from FIG. 2A is also depicted as an example. In the cross-section, multiple slit portions are seen, where each slit portion is between the drain- and source-side columns of a U-shaped NAND string. A portion of the bit line BL0 is also depicted.

Short dashed lines depict memory cells and select gate transistors, as discussed further below. A region 236 of the stack is shown in greater detail in FIG. 3A.

FIG. 3A depicts a close-up view of the region 236 of the column C0 of FIG. 2C, showing a drain-side select gate transistor SGD0 and a memory cell MC303. The region shows portions of the dielectric layers D3 to D5 and the conductive layers WL3 and SG. Each column includes a number of layers which are deposited along the sidewalls of the column. These layers can include oxide-nitride-oxide and polysilicon layers which are deposited, e.g., using atomic layer deposition. For example, a block oxide (BOX) can be deposited as layer 296, a nitride such as SiN as a charge trapping layer (CTL) can be deposited as layer 297, a tunnel oxide (TNL) can be deposited as layer 298, a polysilicon body or channel (CH) can be deposited as layer 299, and a core filler dielectric can be deposited as region 300. Additional memory cells are similarly formed throughout the columns.

When a memory cell is programmed, electrons are stored in a portion of the CTL which is associated with the memory cell. For example, electrons are represented by "−" symbols in the CTL 297 for MC303. These electrons are drawn into the CTL from the channel, and through the TNL. The threshold voltage of a memory cell is increased in proportion to the amount of stored charge.

During an erase operation, as discussed further below, a voltage in the channel is raised due to gate-induced drain leakage (GIDL). The voltage of the one or more selected word line layers is then driven down to a reduced level such as 0 V to create an electric field across the TNL which causes holes to be injected from the memory cell's body to the CTL, resulting in a large Vth downshift toward an erase-verify level, Vv_erase. This process can be repeated in successive iterations until a verify condition is met, as discussed further below. For unselected word lines, the word lines remain at an elevated level so that the electric field across the TNL is relatively small, and no, or very little, hole tunneling will occur. Memory cells of the unselected word lines will experience little or no Vth downshift, and as a result, they will not be erased.

FIG. 3B depicts a cross-sectional view of the column C0 of FIG. 3A. Each layer is ring-shaped in one possible approach, except the core filler, which is cylindrical.

Figure 4B:
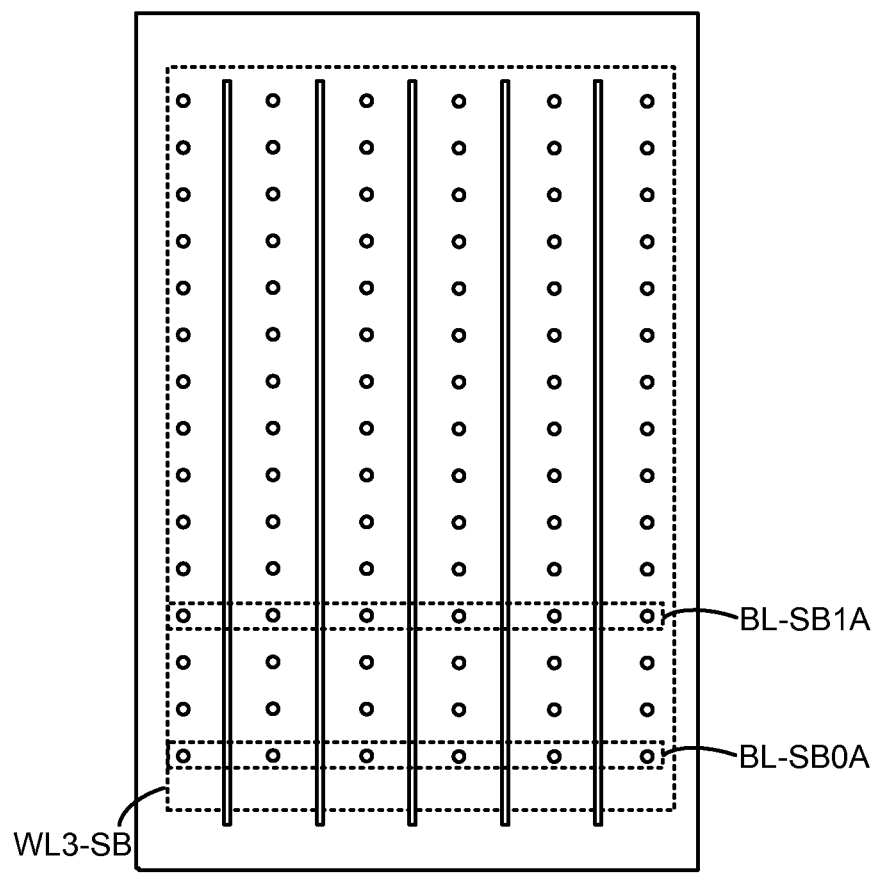
FIG. 4B depicts the block BLK0 of FIG. 4A, showing an example WL line subset WL3-SB and example bit line subsets BL-SB0A and BL-SB1A.

FIG. 4A depicts a top view of a straight NAND string embodiment 480 of the block BLK0 of FIG. 1A, showing example SGD line subsets SGDL-SB0A and SGDL-SB1A. In this configuration, a NAND string has only one column, and the source-side select gate is on the bottom of the column instead of on the top, as in a U-shaped NAND string. Moreover, a given level of a block has one word line layer which is connected to each of the memory cells of the layer. For example, FIG. 4B depicts the block BLK0 of FIG. 4A, showing an example WL line subset WL3-SB and example bit line subsets BL-SB0A and BL-SB1A. A number of slits, such as example slit 482, can also be used. These insulation-filled slits are used in the fabrication process to provide structural support for the stack when undoped polysilicon layers are removed by a wet etch and a dielectric is deposited to form the alternating dielectric layers. A dashed line 486 extends through columns C12 to C17. A cross-sectional view along line 486 of portion 488 is shown in FIG. 4C.

Figure 4C:
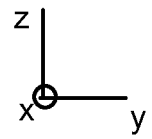
FIG. 4C depicts a cross-sectional view of the portion 488 of the block 480 of FIG. 4A along line 486.
Figure 4C:
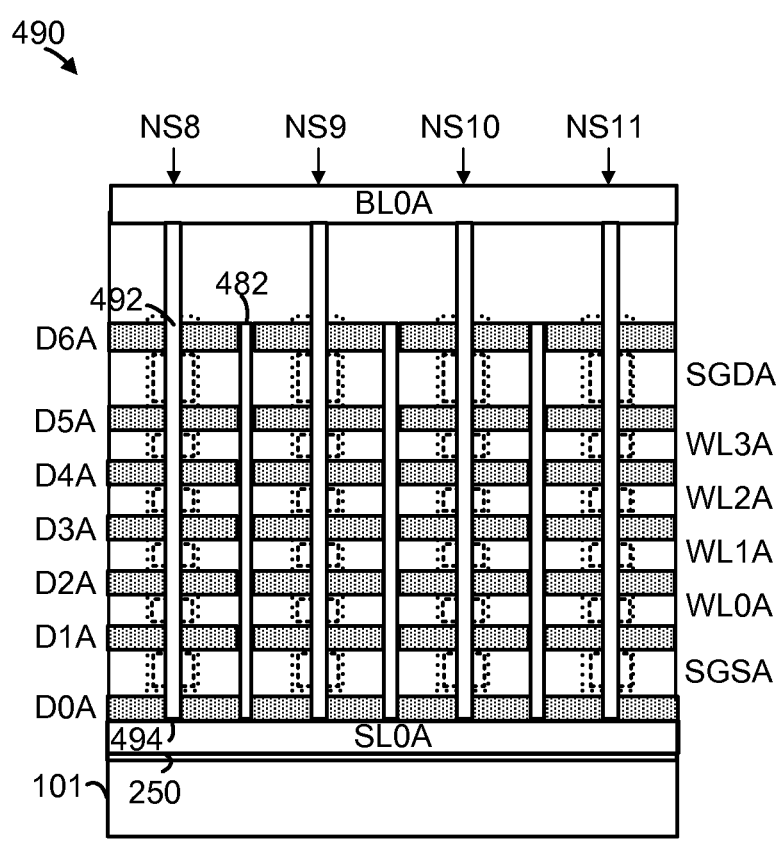

FIG. 4C depicts a cross-sectional view of the portion 488 of the block 480 of FIG. 4A along line 486. Columns of memory cells corresponding to NAND strings NS8 to NS11 are depicted in the multi-layer stack. The stack 490 includes a substrate 101, an insulating film 250 on the substrate, and a portion of a source line SL0A. Recall that the additional straight NAND strings in a SGD line subset extend in front of and in back of the NAND strings depicted in the cross-section, e.g., along the x-axis. NS8 has a source end 494 and a drain end 492. The slit 482 from FIG. 4A is also depicted with other slits. A portion of the bit line BL0A is also depicted. Dashed lines depict memory cells and select gate transistors. The erase techniques described herein can be used with a U-shaped or straight NAND.

Figure 5B:
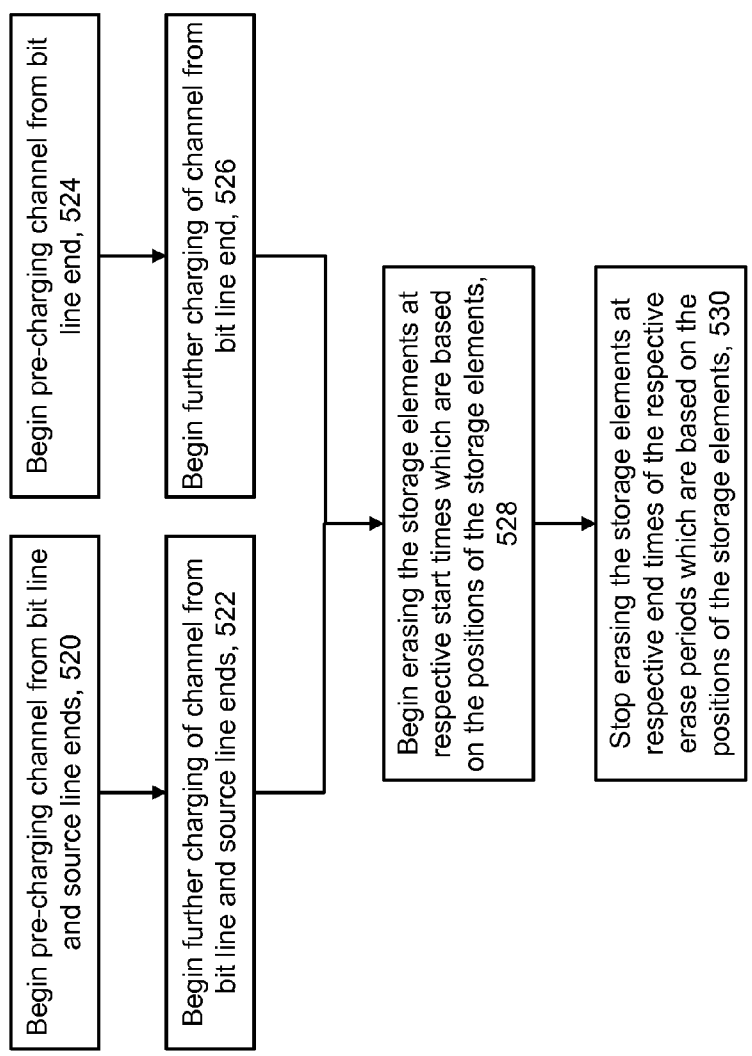
FIG. 5B depicts a flowchart of an example erase process which can be used in step 504 of FIG. 5A.
Figure 5A:
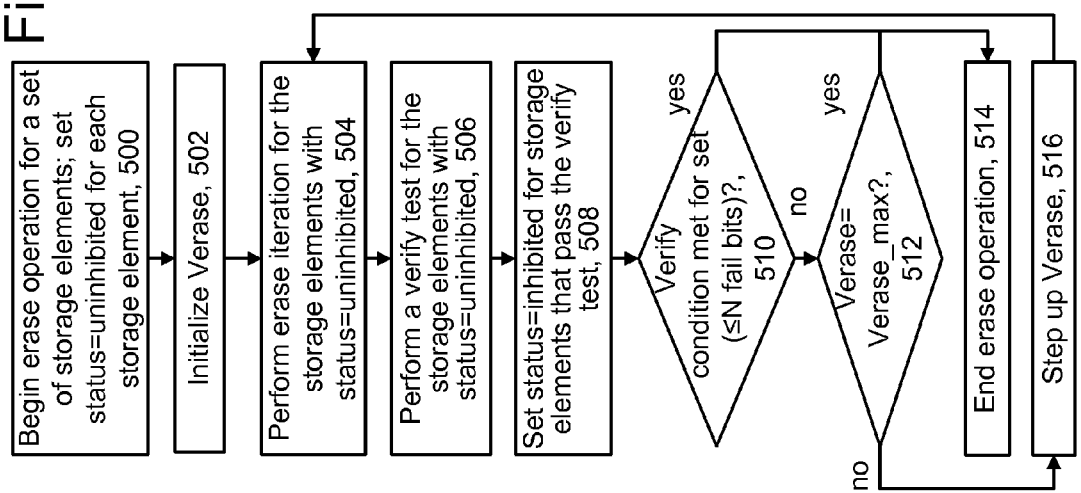
FIG. 5A depicts a flowchart of an example erase process.

FIG. 5A depicts a flowchart of an example erase process. Step 500 begins the erase operation for a set of storage elements, e.g., a block or sub-block. A status=uninhibited is set for each storage element to be erased. Generally, all, or only a portion of the storage elements can be selected to be erased. When only a portion of the storage elements in a string are to be erased, for instance, the storage elements may be adjacent and/or non-adjacent to one another. Further, the end storage element may be treated as a dummy storage element which is not subject to being erased.

Status data can be maintained for each storage element or word line indicating whether the storage element or word line has a status of "inhibited," which indicates that the storage element or word line is to be inhibited from further erasing in the erase portion of a successive erase iteration of the erase operation, or a status of "uninhibited," which indicates that the storage element or word line is not to be inhibited from further erasing in the erase portion of a successive erase iteration of the erase operation (that is, the storage element or word line is to continue to undergo erasing). The status data can be maintained by the on-chip control circuitry 110 or the off-chip controller 122, for instance, and updated based on results of a verify test of each erase iteration. Status data can also be maintained for each subset so that subsets can be independently inhibited or uninhibited.

Step 502 initializes Verase, the peak voltage which is applied to a bit line in a one-sided erase operation, or to both a bit line and a source line in a two-sided erase operation. See also FIG. 6C. Step 504 performs an erase iteration for the storage elements with status=uninhibited so that these storage elements undergo erasing. An example erase iteration is described further in connection with FIG. 5B. Step 506 performs a verify test for the storage elements with status=uninhibited. The verify test indicates which memory cells have a Vth below a verify voltage, Vv_v_erase. A storage element is considered to pass the verify test when its Vth is below Vv_v_erase, and a storage element is considered to fail the verify test when its Vth is not below Vv_erase. A fail bit count can be provided which indicates a number of storage elements which fail the verify test. Or, a pass bit count can be provided which indicates a number of storage elements which pass the verify test. Step 508 sets status=inhibited for storage elements that pass the verify test.

Decision step 510 determines if a verify condition is met for the set of storage elements. For example, a verify condition may be met when there are ≤N fail bits, where N is a natural number. For example, N may be 1-10% of the total number of memory cells in the set. If decision step 510 is true, the erase operation ends successfully at step 514. When a subset of storage elements is erased, N can vary based on the type of the subset (e.g., WL subset, SGD line subset or BL subset). If decision step 510 is false, decision step 512 determines if Verase=Verase_max, where Verase_max is a maximum allowable erase voltage. To avoid damage, this voltage is limited to a maximum. If decision step 512 is true, the erase operation ends unsuccessfully at step 520. If decision step 512 is false, Verase is stepped up at step 516 and a next erase iteration is performed at step 504.

FIG. 5B depicts a flowchart of an example erase process which can be used in step 504 of FIG. 5A. An erase process can apply an erase voltage to one or both sides of a string, in a one-sided or two-sided erase, respectively. Steps 520 and 522 involves two-sided erase while steps 524 and 526 involve one-sided erase. Steps 528 and 530 are common to one-sided and two-sided erase. Step 520 is to begin pre-charging the channel from bit line and source line ends. For example, this can involve setting Vbl=Vsl=Vgidl, and floating or driving the control gates at a level which discourages erasing. Vbl is the bit line voltage, Vsl is the select line voltage and Vgidl is a predetermined voltage level. See FIG. 7A from t1-t3 for further details regarding Vbl and Vsl. See FIGS. 7D and 7F from t1-t3 for further details regarding the control gate voltages. Step 522 is to begin further charging of the channel from the bit line and source line ends. For example, this can involve setting Vbl=Vsl=Verase, where Verase>Vgidl. See FIG. 7A from t3-t14 for further details.

Alternatively, in one-sided erase, step 524 is to begin pre-charging the channel from the bit line end. For example, this can involve setting Vbl=Vgidl, Vsl=2 V, and floating or driving the control gates at a level which discourages erasing. Vsl is biased slightly higher than Vsgs to reverse bias the SGS junction to switch off the SGS transistor and help to charge up the channel with GIDL current. See FIG. 7A from t1-t3 for further details regarding Vbl and Vsl. See FIGS. 7D and 7F from t1-t3 for further details regarding the control gate voltages. Step 526 is to begin further charging of the channel from the bit line end, such as by setting Vbl=Verase (see FIG. 7A from t3-t14) while maintaining Vsl=Vera−Vgidl+2=14V as an example. Once Vbl is boosted to 20 V (Verase), Vsgd=12 V, Vsgs=12 V and Vsl=14 V, for instance. We elevate both Vsgs and Vsl to prevent punch through happening at the SGS transistor.

In the common steps, step 528 is to begin erasing the storage elements at respective start times which are based on the positions of the storage elements. For example, this can involve configuring their control gate voltages at a level which encourages erasing, e.g., driving the control gate voltages lower from the floating or driven level to a reduced level such as 0 V. See FIG. 7D from t3-t9 for further details regarding the control gate voltages for CGD1/CGS1 (two-sided erase) or CGD1 (one-sided erase). These are control gates which are closest to the driven ends of the string. See FIG. 7F from t5-t12 for further details regarding the control gate voltages for CGD31/CGS31 (two-sided erase) or CGD1 (one-sided erase). These are control gates which are furthest from the driven ends of the string.

Step 530 is to stop erasing the storage elements at respective end times of the respective erase periods which are based on the positions of the storage elements, such as by configuring their control gate voltages at a level which discourages erasing. This can involve, e.g., driving the control gate voltages higher from the reduced level to a higher level. See FIG. 7D from t9-t14 for further details regarding the control gate voltages for CGD1/CGS1 (two-sided erase) or CGD1 (one-sided erase). See FIG. 7F from t12-t14 for further details regarding the control gate voltages for CGD31/CGS31 (two-sided erase) or CGD1 (one-sided erase).

Figure 6A:
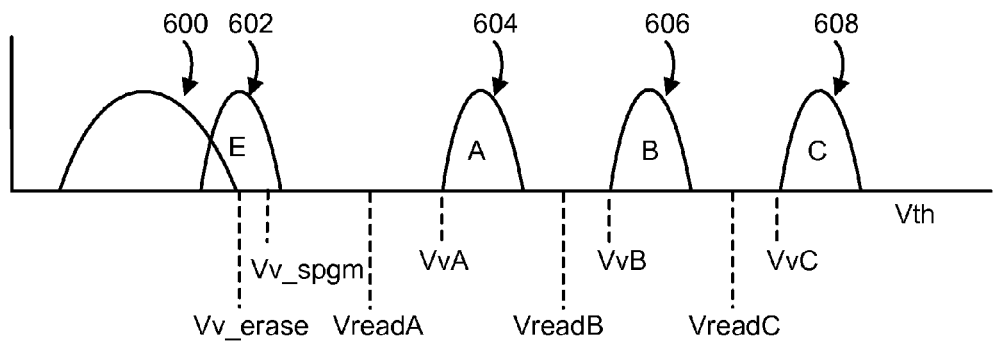
FIG. 6A depicts threshold voltage distributions of a deep erased state, a final erased state and higher data states of one example erase operation.

FIG. 6A depicts threshold voltage distributions of a deep erased state, a final erased state and higher data states of one example erase operation. Storage elements can be programmed so that their threshold voltages are in respective ranges which represent data states. Initially, an erase operation is performed which places all of the storage elements in the erased state (E). Subsequently, some of the storage elements can be programmed to a higher threshold voltage such as to represent the A, B or C data states.

The x-axis indicates a threshold voltage and the y-axis indicates a number of storage elements. In this example, there are four data states (each represented by a threshold voltage distribution): an initial (deep) erased state distribution 600, a soft programmed erased state (E) distribution 602, an A state distribution 604, a B state distribution 606 and a C state distribution 608. Memory devices with additional data states, e.g., eight or sixteen data states, can also be used. The distribution 600 is realized after the erase operation when storage elements are typically over-erased, past the erase state distribution 602. In the erase operation, one or more erase pulses are applied to the NAND string at its source and/or drain ends, until the threshold voltage of the storage elements being erased transitions below an erase-verify level, Vv_erase which can be 0 V or close to 0 V, in one approach. Once the erase operation is completed for a block, the soft programming operation can be performed, in which one or more positive voltage pulses are applied to the control gates of the storage elements, such as via a word line, to increase the threshold voltages of some or all of the storage elements in the distribution 600 closer to and below a soft programming (SPGM) verify level, Vv_spgm, to the erased state distribution 602.

For example, a certain, small fraction of the storage elements may be soft programmed to have a Vth above Vv_spgm, at which point the soft programing ends, leaving most of the other storage elements with a Vth which is close to, but below, Vv_spgm. Vv_spgm is typically above or equal to Vv_erase. The soft programming operation advantageously results in a narrow erase state distribution 602. Once the soft programming operation is complete, programming to higher data states can occur, such as to states A, B and C using verify levels VvA, VvB and VvC, respectively. A subsequent read operation can use the levels VreadA, VreadB and VreadC.

Figure 6B:
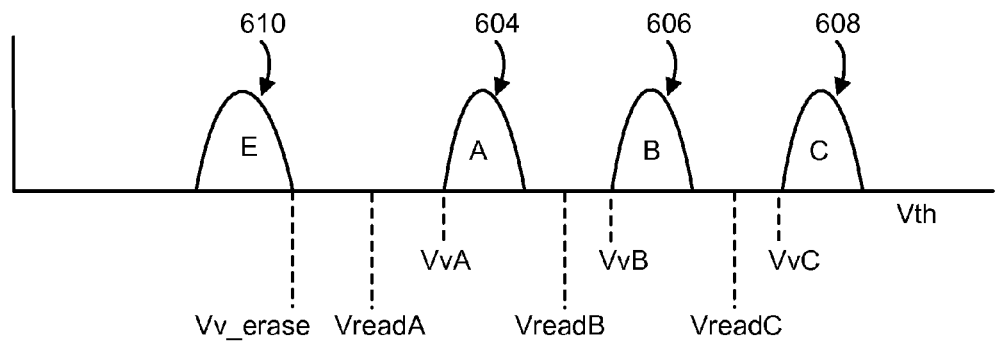
FIG. 6B depicts threshold voltage distributions of a soft erased state and higher data states of another example erase operation.

FIG. 6B depicts threshold voltage distributions of a soft erased state and higher data states of another example erase operation. In this approach, the erase state distribution 610 is reached after a soft erase. In one option, no soft programming is performed. Vv_erase can be the same or different in FIGS. 6A and 6B.

The sequential word line erase techniques discussed herein can be used in the erase processes of FIGS. 6A and 6B, as an example.

Figure 6C:
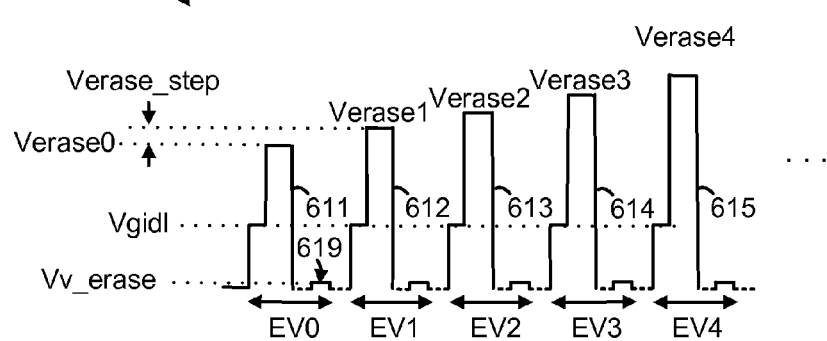
FIG. 6C depicts a series of erase pulses and verify pulses in an erase operation, where Verase is stepped up in successive erase-verify iterations.

FIG. 6C depicts a series of erase pulses and verify pulses in an erase operation, where Verase is stepped up in successive erase-verify iterations. A waveform 620 represents a number of erase-verify iterations EV0, EV1, EV2, . . . . Each erase-verify iteration includes an erase pulse 611-615 followed by a verify pulse such as 619 of magnitude Vv_erase. The erase pulses have two levels. A first level is Vgidl and a second level is Verase. In this example, Verase is stepped up in each iteration by a step size Verase_step so that erase pulse 611 has a peak amplitude of Verase0, erase pulse 612 has a peak amplitude of Verase1, erase pulse 613 has a peak amplitude of Verase2, erase pulse 614 has a peak amplitude of Verase3, and erase pulse 615 has a peak amplitude of Verase_max, a maximum allowed level of Verase. In this case, the maximum erase voltage is reached relatively soon in the erase operation. Vgidl can be fixed in each erase pulse or varying, such as by stepping up with each erase pulse. Each erase pulse corresponds to the waveform in FIG. 7A at time t1-t15.

FIG. 7A-7F depicts example voltages during the erase portion of an erase-verify iteration of an erase operation.

An erase operation can include multiple erase-verify iterations, e.g., EV0, EV1, EV2, . . . such as discussed in connection with FIG. 6C. Each erase-verify iteration can include an erase portion (or iteration) followed by a verify portion (or iteration). Moreover, each erase portion can have multiple levels. In one approach, a two-level erase portion is used. Further, an erase operation can involve a one-sided or a two-sided erase. A one-sided erase applies a voltage to the drain-end of a NAND string via a bit line to charge up the NAND string, while the source-end of the NAND string is not used to charge up the NAND string. A two-sided erase charges up a NAND string via both the drain-end and the source-end. Two-sided, or both-sided erase is faster than one-sided erase but requires a larger chip size. Generally, the erase portion can include a pre-charge phase (t1-t3) and an erase phase (t3-t14).

FIGS. 7A-7F have a common time axis but the time increments are not necessarily equally spaced and the figures are not necessarily to scale. Moreover, the voltage levels provided are examples only as other values can be used.

Figure 7A:
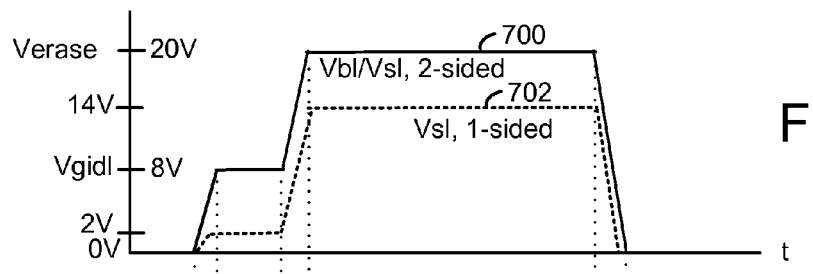
FIG. 7A-7F depicts example voltages during the erase portion of an erase-verify iteration of an erase operation.

FIG. 7A depicts example voltages for a bit line and source line in a two-sided erase, or for a source line in a one-sided erase.

A selected bit line or source line is in communication with one or more NAND strings having storage elements which are to be erased in the current erase iteration. Waveform 700 depicts Vbl and Vsl (two-sided erase), or Vbl (one-sided erase) initially at 0 V (Vss), then being raised to Vgidl (e.g., 8 V) from t2-t3, then being raised to Verase (e.g., 20 V) from t3-t14, then returning to 0 V. Waveform 702 represents Vsl (one-sided erase), which is raised to Vsl=Vera-Vgidl+2=14V, for instance, from t3-t14, and provided at 2 V, for instance, at other times.

When Vbl is at Vgidl, holes are generated at the SGD drain edge so that the channel is charged from the bit line end of the NAND string. Similarly, when Vsl is at Vgidl, holes are generated at the SGS drain edge so that the channel is also charged from the source line end of the NAND string. Vgidl is a voltage which is at or above a minimum voltage for creating GIDL. When Vbl is raised to Verase, charging of the channel continues from the bit line end. Similarly, when Vsl is raised to Verase, charging of the channel continues from the source line end.

Figure 7B:
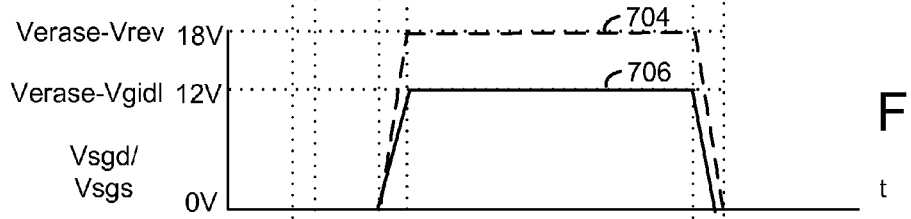

FIG. 7B depicts example voltages for SGD and SGS transistors in a two-sided erase, or for an SGD transistor in a one-sided erase. From t2-t3, with Vbl at 8 V and Vsgd and/or Vsgs at 0 V, the junction of the SGD and/or SGS transistor is reversed biased at Vgidl (the potential difference between Vbl and/or Vsl and Vsgd). As a result, electron-hole pairs will be generated near the bit line and/or source line junctions. Electrons will be swept away by the electrical field and collected at the bit line and/or source line terminals; while holes will drift to the channel and help to charge up the channel. That is, the electrons will drift toward a high potential (e.g., at the BL or SL), while the holes will drift toward a low potential. Given a sufficiently long pre-charge time, the channel will be boosted close to Vgidl.

From t3-t14 (waveform 706), Vsgd and/or Vsgs (selected string) is raised to Verase-Vgidl (e.g., 20-8=12 V). Since Vbl and/or Vsl is raised to Verase at this time, the junction of the SGD and/or SGS transistor is still reversed biased at Vgidl (since Verase-(Verase-Vgidl))=Vgidl. As a result, electron-hole pairs will continue to be generated and the channel will be charged to a higher potential.

For an unselected string (waveform 704), Vsgd and/or Vsgs is raised to Verase-Vrev (e.g., 20-2=18 V). Vrev is a reverse bias such as 2 V which is maintained on the select gate. For one-sided erase of an unselected string, Vsgd is raised to Verase-Vrev (e.g., 20-2=18 V).

Figure 7C:
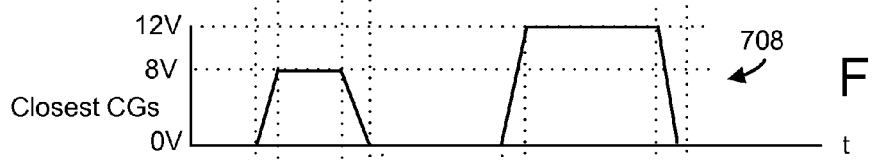

FIG. 7C depicts example control gate voltages for control gates which are closest to a driven end of a NAND string. A waveform 708 is depicted. The control gate voltages, which are also word line voltages, can be floated or driven at a level such as 8 V from t2-t3, driven lower to a reduced level such as 0 V from t5-t9, and raised again to a higher level such as 12 V from t10-t14. The control gate voltages from t2-t3 and t10-t14 are configured at a level which discourages erase of the associated storage elements, while the control gate voltages from t5-t9 are configured at a level which encourages erase of the associated storage elements in an erase period. To encourage erase, the channel voltage should be sufficiently higher than the control gate voltage, e.g., at or above a threshold difference, which encourages tunneling of holes into a charge trapping layer of the storage elements.

The control gate voltages generally can be at a level which encourage charging of the channel through GIDL throughout the erase operation. For example, the control gate voltages from t2-t3 can be floated or driven at a level such as 8 V which is to minimize reverse bias stress on a memory cells' junction. Specifically, when Vbl is biased at 8 V to pre-charge the channel, the maximum channel potential is 8 V. If Vwl is biased at 8 V, memory cell's junction is to see 0 V. Because the maximum channel potential is 8 V, channel potential is not high enough to erase the memory cell. Therefore, we bias Vwl at 8V at that time to minimize the reverse bias stress time on a memory cell's junction. Also, the control gate voltages from t9-t14 can be floated or driven at a level such as 12 V which is large enough to generate GIDL at the gated junctions of the control gates, even though erase of the associated storage elements is discouraged. For example, if Vbl=20 V and Vcg=12 V, the gated junction bias is 8 V which is large enough to generate GIDL without causing further erasing.

The control gate level before the erase period may be lower than after the erase period as shown (e.g., 8 V vs. 12 V) to avoid soft programming of the storage elements which could occur when the channel potential is low. In particular, different regions of the channel will charge up at different rates due to their distance from the driven end of the string and due to potential drops in the channel which occurs when tunneling begins. To address this, each control gate or word line voltage can be configured differently to discourage and encourage erase of the associated storage element based on a position of the control gate in the string. That is, the timing of the erase period, including the start, duration and end, can be tailored to each storage element based on the position of the storage element in a sequence of storage elements. This allows each storage element to be erased by a common amount to provide a narrow Vth distribution (see also FIG. 10B).

In one approach, the control gate which is closest to a driven end of the string will have the first start time of an erase period and the shortest erase period, and the control gate which is furthest from a driven end of the string will have the last start time of an erase period and the longest erase period. Essentially, the control gate which is closest to a driven end of the string is the easiest to erase and the control gate which is furthest from a driven end of the string is the hardest to erase, based on observations. The distance refers to a distance along the string.

For a U-shaped NAND string which is driven from both ends (two-sided erase), the topmost storage element (associated with CGD1/CGS1) can start to erase first and have the shortest erase period while the bottommost storage element (associated with CGD31/CGS31) can start to erase last and have the longest erase period. The intermediate storage elements will have proportionally later start times and longer erase periods, in a direction moving away from the string ends. Although the erase periods are offset, they will generally overlap, at least in part. In an example implementation, assume there are 32 word lines and associated control gates labeled, from top to bottom, CGD0-CGD31 on the drain side and CGS0-CGS31 on the source side (see also FIG. 11A). Further, assume CGD0 and CGS0 are control gates of dummy storage elements which are not erased. Then, in one approach, CGD1-CGD31 and CGS1-CGS31 are involved in the erase operation.

For two-sided erase, CGD1 and CGS1 are closest to the driven bit line and source line ends, respectively, and CGD31 and CGS31 are further from the driven bit line and source line ends, respectively. For one-sided erase, CGD1 is closest to the driven bit line and CGS1 is furthest from the driven bit line.

For a U-shaped NAND string which is driven from the bit line end only (one-sided erase), the topmost storage element on the drain side (associated with CGD1) can start to erase first and have the shortest erase period while the topmost storage element on the source side (associated with CGS1) can start to erase last and have the longest erase period. The intermediate storage elements will have proportionally later start times and longer erase periods, in a direction moving away from the bit line end.

Fewer than all control gates can be involved in the erase operation. For example, adjacent and/or non-adjacent control gates can be involved in the erase operation.

In another aspect, the word lines can receive different control gate biases based on their position.

Note that the control gate voltages are the same as respective word line voltages since each control gate is electrically connected to a respective word line.

Figure 7D:
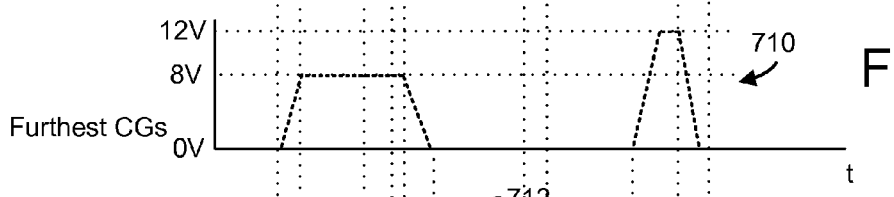

FIG. 7D depicts example control gate voltages for control gates which are furthest from a driven end of a NAND string. A waveform 710 is depicted. For two-sided erase, the erase period starts at t7 (or t6) when the furthest control gates (CGD31/CGS31) are driven to a reduced level, and ends at t12 (or t13) when CGD31/CGS31 are driven back up to a higher level. For one-sided erase, the erase period starts at t7 (or t6) when the furthest control gate (CGS1) is driven to a reduced level, and ends at t12 (or t13) when CGS1 is driven back up to a higher level.

For the control gates which are intermediate to the closest and further control gate, the associated control gate voltages will be between the voltages for the closest and furthest storage element cases of waveforms 708 and 710, respectively.

For an unselected word line, the control gate can be floated or driven at a higher bias such as 12 V. If the channel potential reaches 20 V during erase, the WL is biased at 12 V. Therefore, the gated junction of a data WL is to see 8 V, which is large enough to generate GIDL to expedite charging up the channel. During the pre-charge step, an unselected WL is biased at Vgidl, which is the same as Vbl bias. The only different is that there is no Vss step for the unselected WL bias.

Figure 7E:
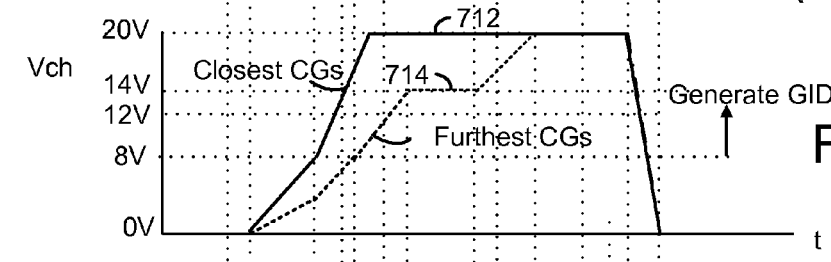

FIG. 7E depicts a channel voltage 712 in a channel region (portion) consistent with FIG. 7C, and a channel voltage 714 in a channel region consistent with FIG. 7D. As indicated, different regions of the channel which are associated with different storage elements can have different potentials at a given time in the erase process. The potential can dynamically change at the different regions of the channel based on various factors. When Vbl and Vsl are raised to Vgidl, the channel begins to be boosted, due to hole generation from GIDL, to a predetermined level which is close to Vgidl. Essentially, Vch=Vgidl if given enough pre-charge time. Here, waveform 712 indicates that Vch reaches Vgidl at t3 for the channel region of the closest control gate, and waveform 712 indicates that Vch reaches Vgidl at t5 for the channel region of the furthest control gate.

Each region of the channel will reach the predetermined level at a slightly different time, based on the relative position of the channel region along the string. Thus, the start times of the erase periods are different. The channel region of CGD1/CGS1 will reach the predetermined level first, followed by the channel region of CGD2/CGS2, and so forth. The potential of the channel region of CGD2/CGS2 is less than the potential of the channel region of CGD1/CGS1. As more control gates of data word lines are lowered to Vss, additional holes will be generated at their gated junctions to help expedite charging up the channel.

Thus, the delay in driving the control gates to Vss between each word line layer becomes smaller further away from the driven ends of the strings. Once the storage elements of selected data word lines are expected to reach their erase levels (e.g., at t9 for the closest control gates and t12 for the furthest control gates), their control gates are biased at a level such as 12 V (Vgidl'). The difference between channel potential and Vgidl' should be large enough to generate GIDL at the gated junctions; while small enough to avoid erasing the storage elements. Therefore, over-erasing of the selected data WLs is avoided as is. Unnecessary slowing down of the erase speed of storage elements further away from the driven end is also avoided. With data WLs reaching their erase levels being biased at Vgidl', multiple local potential drops might not be observed.

An alternative double sided WL sequential selection method is to float unselected data WLs instead of biasing them at Vgidl'. In this case, once the data WLs reach their erase levels, they start to float. Even if multiple local potential drops are unavoidable during erasing, they might be minimized. The data WLs further away from the driven end are expected to have a slower erase speed due to multiple local potential drops. Thus, a longer erase period is expected for the data WLs further away from the driven end.

For one sided erase, the unselected WLs are biased at Vgidl' instead of being floated during erase. A difference from two sided WL sequential selection erase is that GIDL current is only generated at the gated junction of SGD first. Holes flow to the SL direction instead of the bottom layer to charge up the channel; while electrons are swept to the BL. WL sequential selection is from the top to the bottom layer along the BL or drain side of the string, and then from the bottom to the top layer along the SL or source side of the string. In the double sided WL sequential selection method, WL selection is from the top to the bottom, layer by layer. WLs at the same layer are selected at the same time due to the symmetric behavior along both the BL side and the SL side. Memory cells close to the SL, far from the driven bit line end, are expected to have a slow speed due to multiple local potential drops along the channel.

With the WL sequential selection method in a block and sub-block erase process, erase speeds are expected to become faster due to holes generated at the gated junctions of data WLs to expedite charging up the channel; erase distributions are expected to become smaller due to the minimization of multiple local potential drop effects; and GIDL current requirements on the select gate are expected to become more relaxed, which might help to boost channel potential to reduce Vpgm disturb and might improve the reliability of select device.

In one approach, the erase period can start when Vch is expected to reach the predetermined level. It is desirable to start the erase period for the storage elements when their respective channel regions have reached a common potential to provide a narrow Vth distribution.

Once Vch reaches Vgidl for the closest control gate (waveform 712), Vch is boosted higher when Vbl/Vsl is boosted higher to Verase, as the GIDL continues. Vch is boosted about to the level of Verase. Vch reaches Verase sooner for the closest control gate (waveform 712) than for the furthest control gate (waveform 714). Vch for the furthest control gate (waveform 714) initially plateaus at a level which is between Vgidl and Verase, such as about 14 V, from t8-t9. This is due to multiple local potential drops, e.g., due to the tunneling of holes into the charge trapping layer regions associated with the storage elements which are closer to the driven string end.

Eventually, a sufficient number of holes travel to the channel region for the furthest control gate, allowing Vch to reach Verase. Note that the waveforms of FIG. 7E are simplifications of the dynamic changes which occur in the channel. GIDL is encouraged for a channel region when Vch for the channel region is at or above a threshold difference such as 8 V.

Once Vbl and Vsl are lowered from Verase to 0 V at t15, the channel potential also returns to 0 V.

For the storage elements which are intermediate to the closest and furthest control gates, the associated Vch will be between the closest and furthest control gate cases of waveforms 712 and 714, respectively.

Figure 7F:
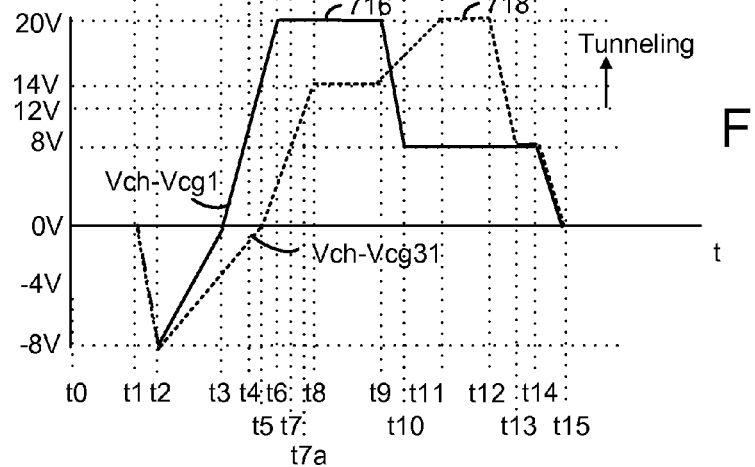

FIG. 7F depicts a tunneling voltage 716 in a channel region based on waveform 708 in FIG. 7C subtracted from waveform 712 of FIG. 7E, and a tunneling voltage 718 in a channel region based on waveform 710 in FIG. 7D subtracted from waveform 714 of FIG. 7E. A tunneling voltage is a channel-to-control gate voltage of a storage element. As mentioned, to encourage erase, the channel voltage should be sufficiently higher than the control gate voltage, e.g., at or above a threshold difference, which encourages tunneling of holes into a charge trapping layer of the storage elements. As an example, assume this threshold difference is 12 V. Thus, tunneling occurs when Vch−Vcg>12 V. Since Vch can vary for different channel regions, the tunneling voltage can also vary for different storage elements at a given time in the erase process.

Referring to waveform 716, initially, from t0-t3, Vch−Vcg is negative. Vch−Vcg increases above 12 V at t4 when the closest control gate is driven to 0 V. Vch−Vcg increases further to about 20 V at t6 due to the increase in Vch. Vch−Vcg decreases from 20 V to 8 V at t9-t10 when the closest control gate is driven to 12 V. Thus, tunneling for the storage elements associated with the closest control gate occurs from about t4-t9, which is the erase period. Vch−Vcg decreases from 8 V to 0 V at t14-t15.

Referring to waveform 718, initially, from t0-t5, Vch−Vcg is negative. Vch−Vcg increases above 12 V at t7a when the furthest control gate is driven to 0 V. Vch−Vcg plateaus at about 14 V from t8-t9. Vch−Vcg increases further to about 20 V at t11 due to the increase in Vch. Vch−Vcg decreases from 20 V to 8 V at t12-t13 when the furthest control gate is driven to 12 V. Thus, tunneling for the storage elements associated with the furthest control gate occurs from about t7a-t12, which is the erase period. Vch−Vcg decreases from 8 V to 0 V at t14-t15.

For the storage elements which are intermediate to the closest and furthest control gates, the associated Vch will be between the closest and furthest control gate cases of waveforms 716 and 718, respectively.

Figure 8A:
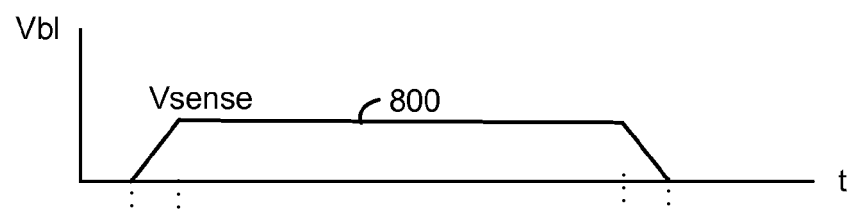
FIGS. 8A-8C depict voltages in the verify portion of an erase-verify iteration of an erase operation.
Figure 8B:
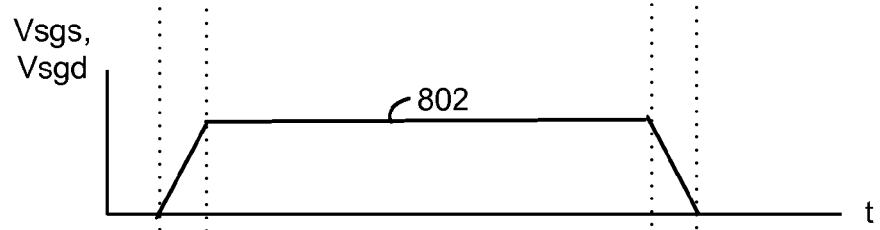
Figure 8C:
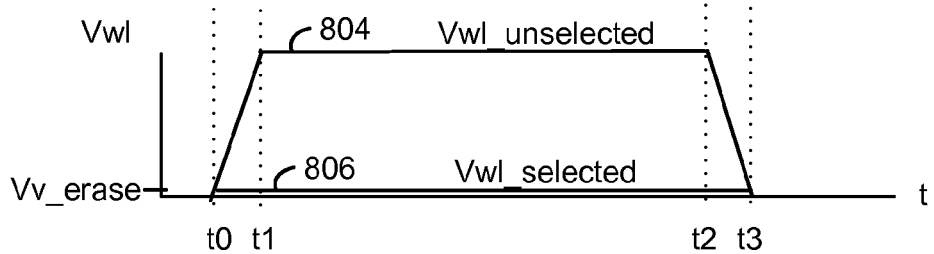

FIGS. 8A-8C depict voltages in the verify portion of an erase-verify iteration of an erase operation. FIG. 8A depicts a bit line voltage 800. FIG. 8B depicts a SGS transistor and SGD transistor voltage 802. FIG. 8C depicts an unselected word line voltage 804 and a selected word line voltage 806. During the verify portion, the selected sets of NAND strings are sensed using sensing circuitry to determine whether the threshold voltages of the selected memory cells have passed the verify test. During the sensing, Vbl is set to a sense voltage, Vsense (waveform 800 in FIG. 8A). Vsgs and Vsgd (waveform 802 in FIG. 8B) are set to a level which renders them conductive. Vsgs and Vsgd can be set to the same or different levels. Vwl_unselected (waveform 804 in FIG. 8C) is set to a sufficiently high level, e.g., 8 V, to render the unselected memory cells in a conductive state. Vwl_selected (waveform 806 in FIG. 8C) is set to Vv_erase. Sensing circuitry connected to a NAND string senses whether the NAND string is in a conductive state, which indicates the selected memory cells of the NAND string have been erased and therefore pass the verify test.

In one approach, the verify portion involves performing the verify test for the selected NAND strings which are connected to one BL (e.g., a BL subset) at a time. FIGS. 8A-8C have a common time axis but the time increments are not necessarily equally spaced and the figures are not necessarily to scale.

Figure 9A:
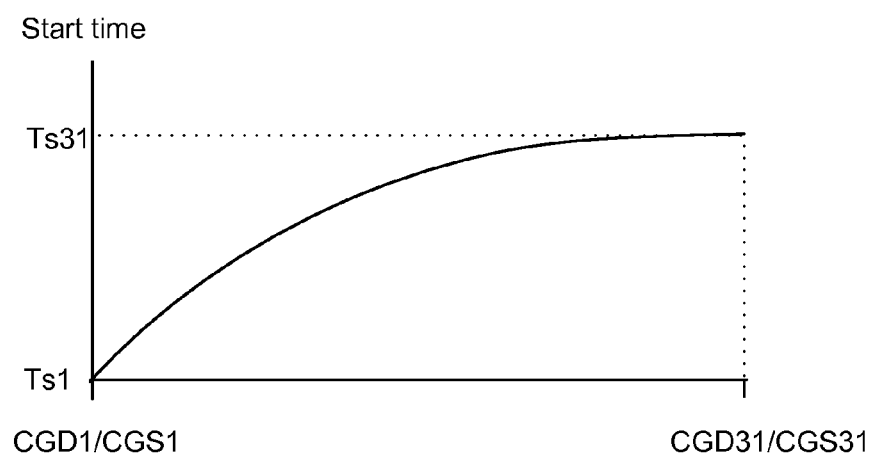
FIG. 9A depicts a delay of a start time of an erase period as a function of a position of a storage element, for two-sided erase.

FIG. 9A depicts a delay of a start time of an erase period as a function of a position of a storage element, for two-sided erase. The x-axis depicts a position of a storage element in a sequence of storage elements, e.g., the position of a storage element in a string, relative to a closest driven end of a string. The y-axis depicts a start time of an erase period of a storage element. The start time of an erase period of the first-erased storage elements, e.g., the storage elements associated with CGD1/CGS1, assuming CGD0/CGS0 are dummy control gates, is a reference time of zero (Ts1=0 msec.) The start time of an erase period of the last-erased storage elements (e.g., CGD31/CGS31) is Ts31 (e.g., Ts1=0.1 msec. or less). The start time is delayed according to a non-linear function such that the start times increase by progressively smaller increments as the distances along the string of the selected memory cells from the driven end of the string become greater.

Figure 9B:
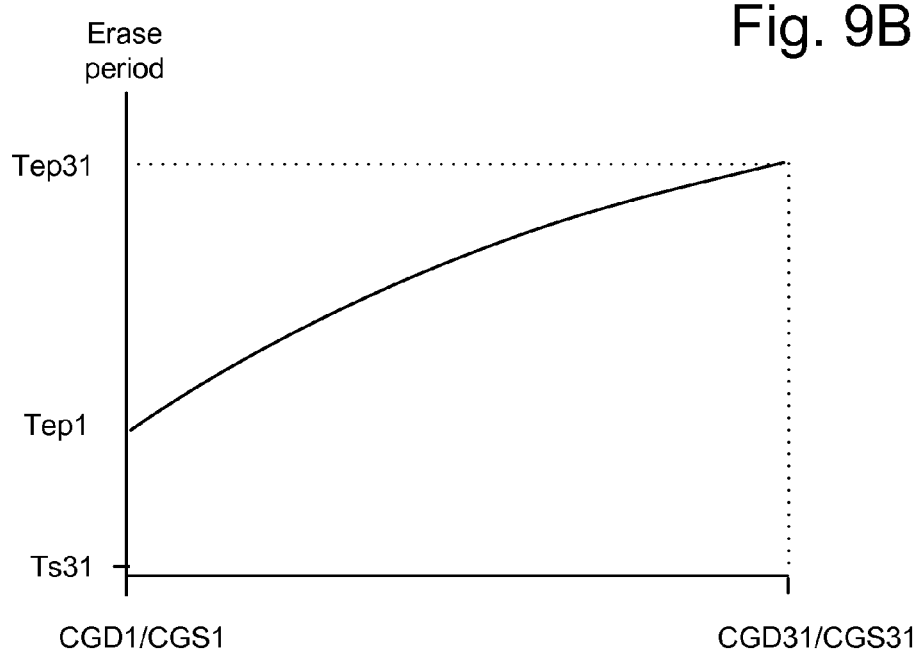
FIG. 9B depicts a duration of an erase period as a function of a position of a storage element, for two-sided erase.

FIG. 9B depicts a duration of an erase period as a function of a position of a storage element, for two-sided erase. The x-axis depicts a position of a storage element in a sequence of storage elements relative to a closest driven end of a string. The y-axis depicts a duration of an erase period of a storage element. The erase period of the first-erased storage elements (e.g., CGD31/CGS31) is a reference time of Tep1 (e.g., 1 msec.) The erase period of the last-erased storage elements (e.g., CGD31/CGS31) is Tep31 (e.g., 3 msec.). The erase period increases according to a linear or non-linear function. In one approach, the respective erase periods increase by progressively smaller increments as the distances along the string of the selected memory cells from the one end of the string become greater. Generally, for each selected memory cell, the respective erase period is greater when a distance along the string of the selected memory cell from the one end of the string is greater. Ts31 is shown for comparison and is typically a small fraction of the erase periods.

Figure 9C:
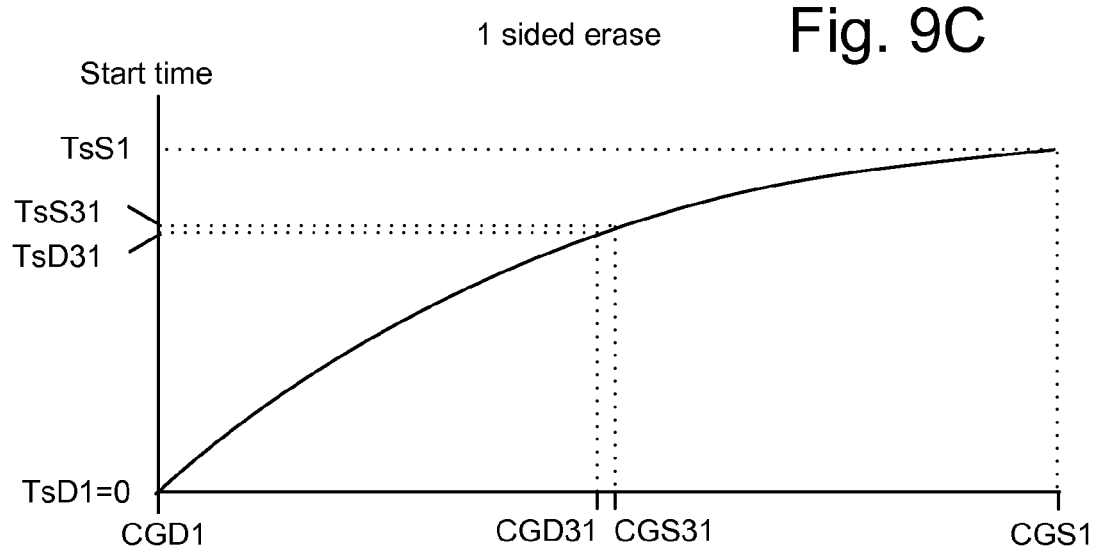
FIG. 9C depicts a delay of a start time of an erase period as a function of a position of a storage element, for one-sided erase.

FIG. 9C depicts a delay of a start time of an erase period as a function of a position of a storage element, for one-sided erase. The x-axis depicts a position of a storage element in a sequence of storage elements, e.g., the position of a storage element in a string, relative to a closest driven end of a string. Of the data (non-dummy) storage elements, CGD1 is closest to the driven drain end and CGS1 is furthest from the driven drain end, assuming CGD0 and CGS0 are dummy control gates. The y-axis depicts a start time of an erase period of a storage element. The start time of an erase period of the first-erased storage element (e.g., CGD1) is a reference time of zero (TsD1=0 msec.) The start time of an erase period of the last-erased storage element (e.g., CGS1) is TsS1 (e.g., TsS1=0.1 msec. or less).

Figure 9D:
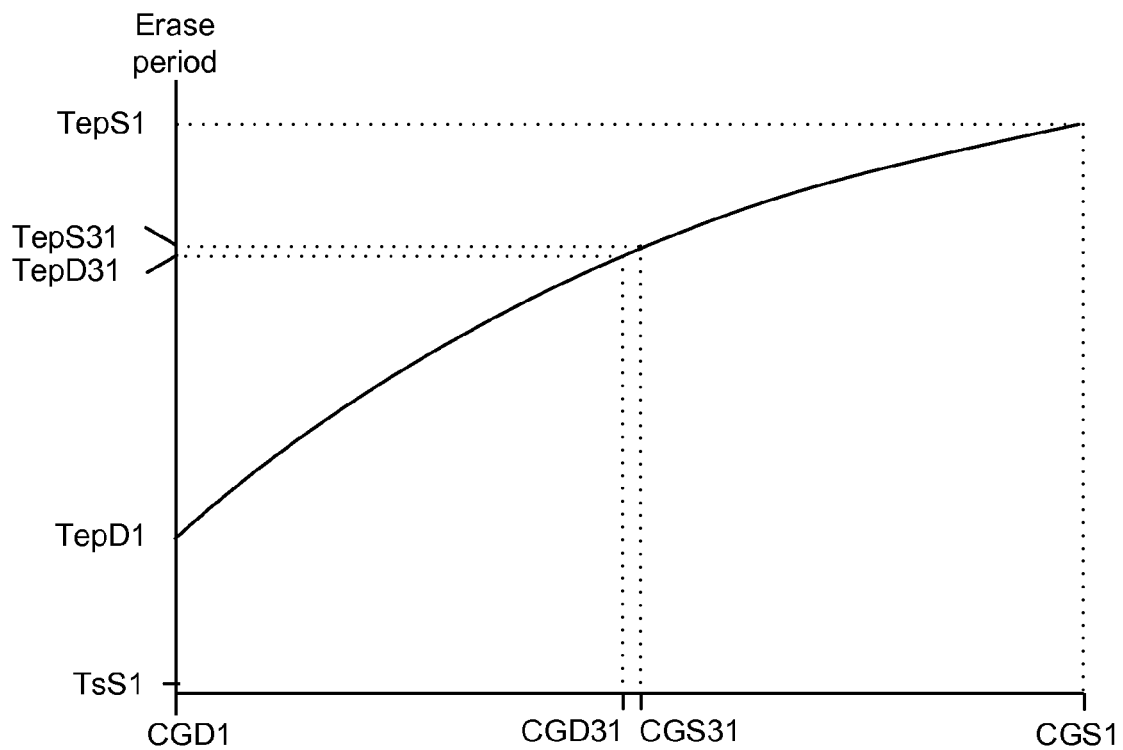
FIG. 9D depicts a duration of an erase period as a function of a position of a storage element, for one-sided erase.

FIG. 9D depicts a duration of an erase period as a function of a position of a storage element, for one-sided erase. The x-axis depicts a position of a storage element in a sequence of storage elements relative to a closest driven end of a string. The y-axis depicts a duration of an erase period of a storage element. The erase period of the first-erased storage element (e.g., CGD1) is a reference time of TepD1 (e.g., 1 msec.) The erase period of the last-erased storage element (e.g., CGS1) is TepS1 (e.g., 3 msec.) TsS1 is shown for comparison, and is typically a small fraction of the erase periods.

In one variation, the storage element are grouped into multiple groups, and the storage elements in one group have a same start time and/or erase duration, while different groups have different same start times and/or erase durations. Thus, the WL sequential selection method is not limited to WL by WL selection. Instead, several WLs adjacent to each other could be grouped so that they are selected together to simplify the erase process. The erase process becomes a group-by-group sequential selection process. For example, referring to FIGS. 9A and 9B, progressively larger groups may be defined as: CGD1/CGS1 and CGD2/CGS2, CGD3/CGS3-CGD7/CGS7, CGD8/CGS8-CGD15/CGS15 and CGD16/CGS16-CGD31/CGS31. Referring to FIGS. 9C and 9D, progressively larger groups may be defined as: CGD1 and CGD2, CGD3-CGD7, CGD8-CGD15, CGD16-CGD31, CGS31-CGS16, CGS15-CGS8, CGS7-CGS3, CGS2 and CGS1. The selected storage elements may thus be arranged in progressively larger groups in a direction moving away from the driven end (one end) of the string, where each group has at least one of a common start time and a duration.

These are examples of groups with different numbers of word lines, where the groups have increasingly more word lines further from the drive end or ends of the strings. The groups can share a roughly similar start time and erase period. Another variation is a hybrid process in which one or more individual word lines are selected and one or more groups are selected. For example, referring to FIGS. 9A and 9B, CGD1/CGS1 might be individually selected, followed by increasingly larger groups as mentioned.

Figure 10A:
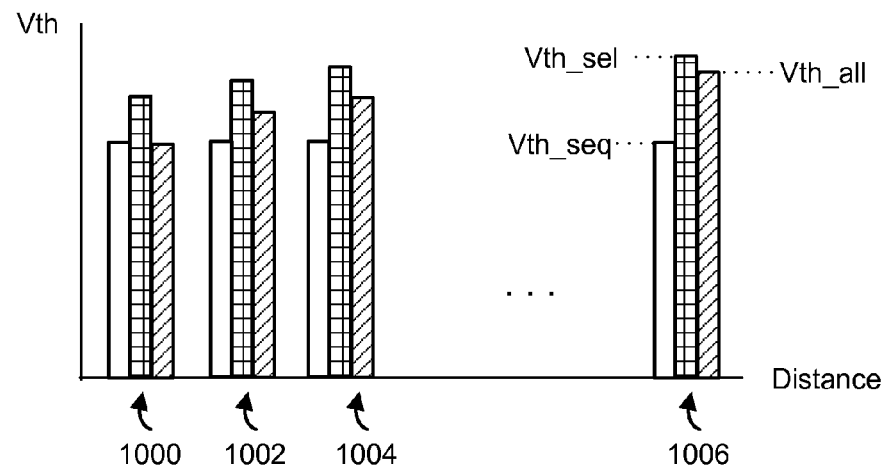
FIG. 10A depicts a uniform erase depth which is achieved using a sequential word line erase compared to a selective word line erase and an all word line erase.

FIG. 10A depicts a uniform erase depth which is achieved using a sequential word line erase compared to a selective word line erase and an all word line erase. The x-axis depicts a distance of a storage element from the closest driven end of the string and the x-axis depicts the Vth of an upper tail of the Vth distribution for storage elements in different strings but with a common distance. For example, a set of bars 1000 show the Vth for storage elements which are closest to a driven end of a respective string, for the case of sequential word line erase as described herein, selective word line erase (one word line at a time) and all word line erase. Sets of bars 1002, 1004, . . . , 1006 show the Vth for storage elements which are successively further from a driven end of a respective string. The unpatterned bars represent the sequential word line erase, the bars with a cross-hatched pattern represent the selective word line erase and the bars with the slanted line pattern represent the all word line erase. The set of bars 1006 have the amplitudes Vth_seq, Vth_sel and Vth_all.

A higher amplitude bar represents a higher Vth and therefore a relatively less-erased storage element. For a narrow Vth distribution, the storage elements should be relatively equally erased. Comparing the unpatterned bars in the different sets of bars, it can be seen that the sequential word line erase process results in a relatively uniform erase depth and therefore a narrower Vth distribution which is advantageous. In contrast, the bars of the selective word line erase and all word line erase processes become higher as the distance increases, leading to a wider Vth distribution. The sequential word line erase process also results in a faster erase speed. The erase speed for all WL erase mode is second, and the erase speed for the selective WL erase mode is third.

Figure 10B:
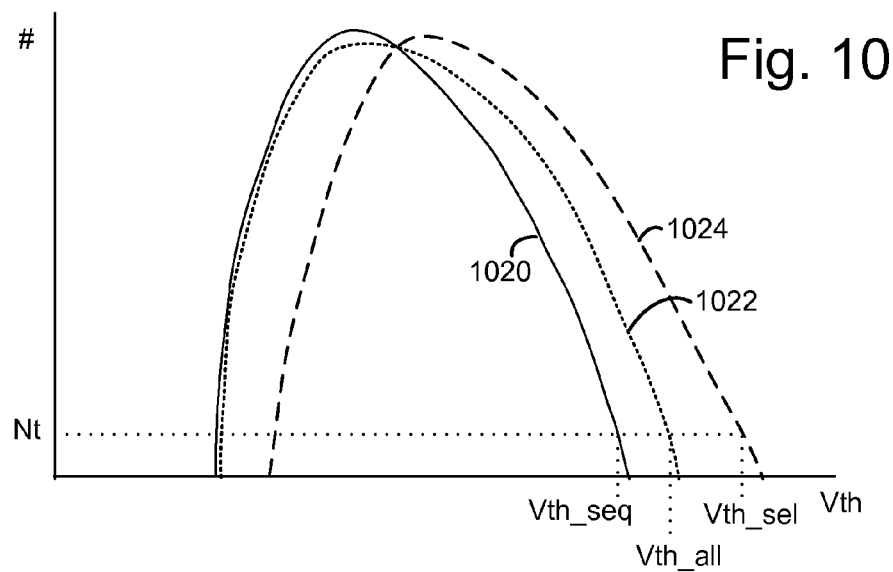
FIG. 10B depicts a narrowed Vth distribution which is achieved using a sequential word line erase compared to a selective word line erase and an all word line erase, consistent with the set of bars 1006 in FIG. 10A.

FIG. 10B depicts a narrowed Vth distribution which is achieved using a sequential word line erase compared to a selective word line erase and an all word line erase, consistent with the set of bars 1006 in FIG. 10A. Distributions 1020, 1022 and 1024 represent the sequential, all and selective word line erase cases, respectively. As can be seen, the sequential word line erase results in the narrowest Vth distribution. The upper tail of a Vth distribution refers to the right hand portion of the distribution. The tail can be measured as the Vth corresponding to a specified number Nt of storage elements. The values Vth_seq, Vth_all and Vth_sel correspond to the like-named values for the set of bars 1006.

Figure 11A:
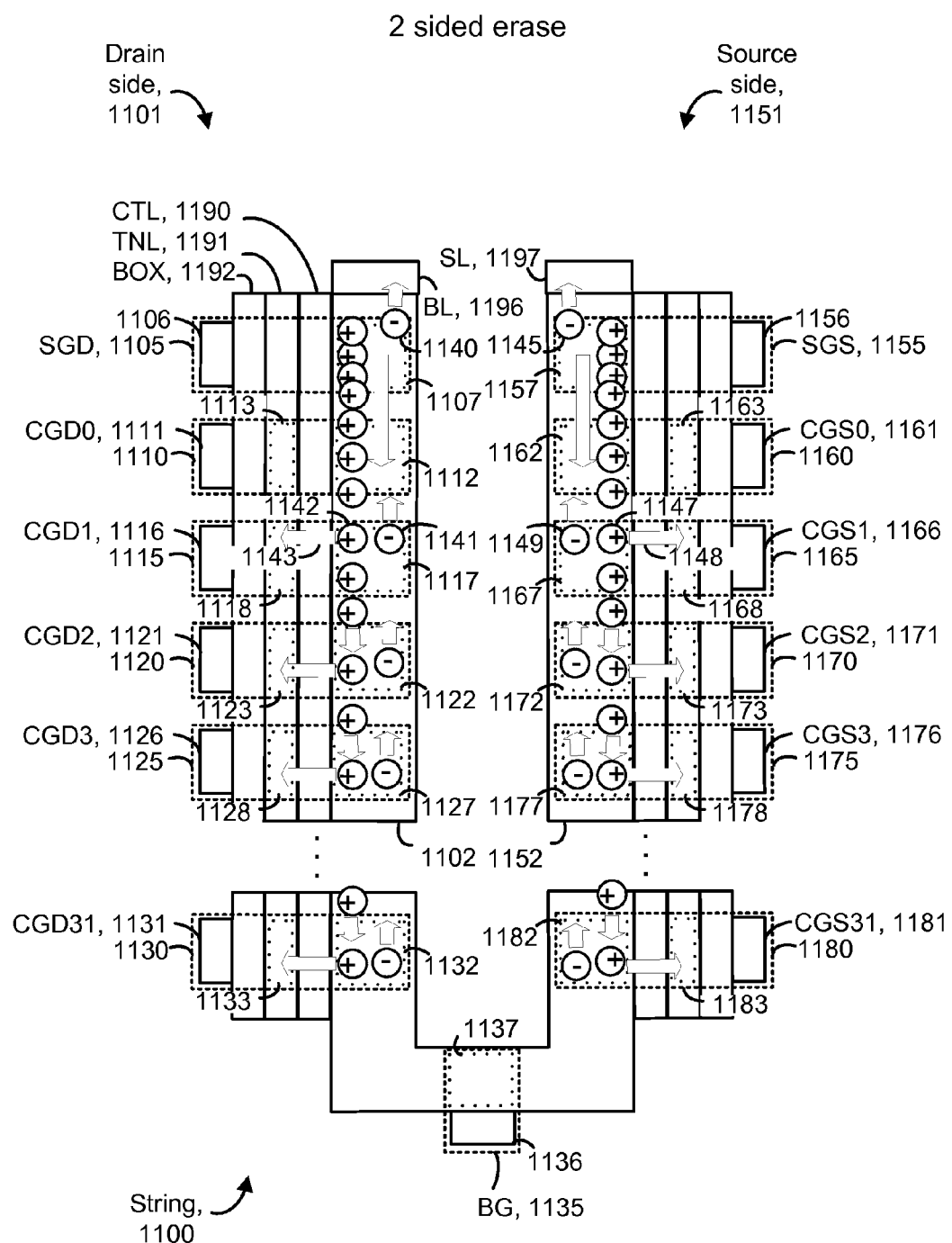
FIG. 11A depicts the movement of holes and electrons in a U-shaped NAND string during a two-sided erase.

FIG. 11A depicts the movement of holes and electrons in a U-shaped NAND string during a two-sided erase. Consistent with the previous discussions, an example U-shaped NAND string 1100 includes a drain side 1101 and a source side 1151. The drain side includes a channel layer 1102 connected to a bit line 1196 which continues as a channel layer 1152 on the source side connected to a source line 1197. A charge trapping layer (CTL) 1190, a tunnel layer (TNL) 1191 and a block oxide (BOX) 1192 are ring shaped layers which extend around the memory hole of the string. Different regions of the channel layers represent channel regions which are associated with respective storage elements or select gate transistors. These channel regions are at a same height and stack level in the stacked memory device as the control gates of the storage elements or select gate transistors.

The drain side includes a SGD transistor 1105 with a control gate 1106 and a channel region 1107. The drain side also includes storage elements 1110, 1115, 1120, 1125 and 1130, control gates 1111, 1116, 1121, 1126 and 1131, CTL regions 1113, 1118, 1123, 1128 and 1133, and channel regions 1112, 1117, 1122, 1127 and 1132, respectively.

The source side includes a SGS transistor 1155 with a control gate 1156 and a channel region 1157. The source side also includes storage elements 1160, 1165, 1170, 1175 and 1180, control gates 1161, 1166, 1171, 1176 and 1181, CTL regions 1163, 1168, 1173, 1178 and 1183, and channel regions 1162, 1167, 1172, 1177 and 1182, respectively.

A back gate 1135 has a control gate 1136 and a channel region 1137.

Representative holes are depicted in the channel layers as circles with a "+" sign and representative electrons are depicted in the channel layers as circles with a "−" sign. As discussed previously, electron-hole pairs are generated by a GIDL process. Initially, during an erase process, the electron-hole pairs are generated at the SGD and SGS transistors. The holes move away from the driven ends, thereby charging the channel. The electrons move toward the bit line due to the positive charge there. Subsequently, during the erase period of each storage element, additional holes are generated by GIDL at junctions which are formed in the channel for the storage element. However, holes are also removed from the channel as they tunnel to the CTL regions.

Electrons are also generated by the GIDL process. Initially, during the erase process, the electrons are generated at the SGD and SGS transistors and move toward the driven ends. Subsequently, during the erase period of each storage element, additional electrons are generated by GIDL at junctions which are formed in the channel for the storage element.

In the drain side, example electrons 1140 and 1141 move toward the bit line. Electron 1140 is generated at the SGD transistor and electron 1141 is generated at a junction of the storage element 1115 in the channel region 1117. Also, in the drain side, example holes including a hole 1142 move away from the bit line as indicated by arrows. The hole 1142 is generated at a junction of the storage element 1115 in the channel region 1117 and can tunnel into the CTL region 1118 as indicated by arrow 1143.

In the source side, example electrons 1145 and 1149 move toward the source line. Electron 1145 is generated at the SGS transistor and electron 1149 is generated at a junction of the storage element 1165 in the channel region 1167. Also, in the source side, example holes including a hole 1147 move away from the source line as indicated by the arrow. The hole 1147 is generated at a junction of the storage element 1165 in the channel region 1167 and can tunnel into the CTL region 1168 as indicated by arrow 1148.

Due to the staggered start times of the erase periods, the tunneling will occur initially for the storage elements which are closest to a driven end of the string and proceed sequentially to the next further storage element. The erase periods are overlapping in part. In the diagram, tunneling is underway for all storage elements.

FIG. 11B depicts the movement of holes and electrons in a U-shaped NAND string during a one-sided erase. The diagram of FIG. 11A is modified to show that the holes on the source side move in the opposite direction of FIG. 11A, away from the bit line end and toward the source line end. Similarly, the electrons on the source side move in the opposite direction of FIG. 11A, toward the bit line end and away from the source line end.

Accordingly, it can be seen that, in one embodiment, a method for performing an erase operation for a string of storage elements in a 3D stacked non-volatile memory device is provided. The method comprises: pre-charging a channel of the string by applying a pre-charge voltage (8 V) to one end of the string (e.g., the bit line end, where another end is a source line end), the string comprises a plurality of selected storage elements; and subsequently, erasing each selected storage element by applying an erase voltage (20 V), higher than the pre-charge voltage (8 V), to the one end of the string to charge the channel higher while configuring control gate voltages (0 V) of the selected storage elements to encourage erasing of the selected storage elements in respective erase periods, at least one of a start time and a duration of each erase period is based on a position of the selected storage element in the string.

In another embodiment, a 3D stacked non-volatile memory device comprises: a string comprising a plurality of selected storage elements, and one or more control circuits. The one or more control circuits, to perform an erase operation for the string: pre-charges a channel of the string by application of a pre-charge voltage (8 V) to one end of the string, then erases each selected storage element by application of an erase voltage (20 V), higher than the pre-charge voltage (8 V), to the one end of the string to charge the channel higher, and by configuration of control gate voltages (0 V) of the selected storage elements which encourage erase of the selected storage elements in respective erase periods, at least one of a start time and a duration of each respective erase period is based on a position of the selected storage element in the string.

In another embodiment, a method for performing an erase operation for a string of storage elements in a 3D stacked non-volatile memory device is provided. The method comprises: pre-charging a channel of the string by applying a pre-charge voltage (8 V) to one end of the string, the string comprises a plurality of selected storage elements; and subsequently, applying an erase voltage (20 V), higher than the pre-charge voltage (8 V), to the one end of the string to charge the channel higher while driving control gate voltages (0 V) of the selected storage elements from a floating or driven level (8 V) to a reduced level (0 V) to encourage erasing of the selected storage elements in respective erase periods, and for each selected storage element, at an end of the respective erase period, driving the control gate voltage higher from the reduced level (0 V) to a level (12 V) which discourages erasing of the selected storage elements, at least one of a start time and a duration of each erase period is based on a position of the selected storage element in the string.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for performing an erase operation, comprising:
  pre-charging a channel of a plurality of selected memory cells, the pre-charging of the channel comprises applying a pre-charge voltage to one end of the channel, the plurality of selected memory cells are formed above a substrate in multiple physical levels of memory cells in a three-dimensional non-volatile memory, the channel is in a pillar which extends vertically in the three-dimensional non-volatile memory and the pillar comprises an active area of the plurality of selected memory cells; and
  subsequently, for each selected memory cell of the plurality of selected memory cells, erasing the memory cell by applying an erase voltage, higher than the pre-charge voltage, to the one end of the channel to charge the channel higher while configuring a control gate voltage of the selected memory cell to encourage erasing of the selected memory cell in an erase period, a timing of the erase period is based on a position of the selected memory cell in the channel.

2. The method of claim 1, wherein:
  the timing of the erase period comprises a start time and a duration of the erase period; and
  for each selected memory cell of the plurality of selected memory cells, the start time and the duration of the erase period are based on the position of the selected memory cell in the channel.

3. The method of claim 1, wherein:
the timing of the erase period comprises a start time of the erase period; and
for each selected memory cell of the plurality of selected memory cells, the start time is later when a distance along the channel of the selected memory cell from the one end of the channel is greater.

4. The method of claim 3, wherein:
the start times increase by progressively smaller increments as the distances along the channel of the plurality of selected memory cells from the one end of the channel become greater.

5. The method of claim 1, wherein:
the timing of the erase period comprises a duration of the erase period; and
for each selected memory cell of the plurality of selected memory cells, the duration of the erase period is greater when a distance along the channel of the selected memory cell from the one end of the channel is greater.

6. The method of claim 5, wherein:
the durations of the erase periods increase by progressively smaller increments as the distances along the channel of the plurality of selected memory cells from the one end of the channel become greater.

7. The method of claim 1, wherein:
the applying the pre-charge voltage to the one end of the channel charges the channel by gate-induced drain leakage of a select gate at the one end of the channel.

8. The method of claim 7, wherein:
the timing of the erase period comprises a start time of the erase period; and
for each selected memory cell of the plurality of selected memory cells, the respective start time is based on a time at which a region of the channel directly beneath the selected memory cell is expected to reach a predetermined voltage.

9. The method of claim 1, wherein:
the control gate voltages which are configured to encourage erasing of the plurality of selected memory cells are at a voltage which is sufficiently low compared to a voltage in the channel to induce tunneling of holes from the channel into charge trapping regions of the plurality of selected memory cells.

10. The method of claim 1, wherein:
the configuring the control gate voltages to encourage erasing comprises driving the control gate voltages lower from a floating or driven level to a reduced level.

11. The method of claim 10, further comprising:
for each selected memory cell of the plurality of selected memory cells, at an end of the erase period for the selected memory cell, driving the control gate voltage higher from the reduced level to a level which discourages erasing of the selected memory cell, the level which discourages erasing of the selected memory cell is sufficiently high compared to a voltage in the channel to discourage tunneling of holes from the channel into charge trapping regions of the selected memory cell.

12. The method of claim 1, wherein:
the timing of the erase period comprises a start time of the erase period; and
the plurality of selected memory cells are arranged in progressively larger groups in a direction moving away from the one end of the channel, each group having a common start time.

13. The method of claim 1, wherein:
the timing of the erase period comprises a duration of the erase period; and
the plurality of selected memory cells are arranged in progressively larger groups in a direction moving away from the one end of the channel, each group having a common duration.

14. The method of claim 1, wherein:
the channel is U-shaped and comprises a drain side which terminates at the one end of the channel, a source side which terminates at another end of the channel and a back gate which joins the drain side and the source side;
the pre-charging the channel of the channel comprises applying the pre-charge voltage to the another end of the channel; and
the erasing each selected memory cell comprises applying the erase voltage to the another end of the channel.

15. The method of claim 1, wherein:
the pre-charging and the erasing are performed by circuitry which is associated with operation of the plurality of selected memory cells and the circuitry is within the substrate.

16. The method of claim 1, wherein:
the pre-charging and the erasing are performed by circuitry which is associated with operation of the plurality of selected memory cells and the circuitry is above the substrate.

17. A non-volatile memory device, comprising:
a substrate;
a plurality of selected memory cells comprising an channel, the plurality of selected memory cells are formed above the substrate in multiple physical levels of memory cells in a three-dimensional non-volatile memory, the channel is in a pillar which extends vertically in the three-dimensional non-volatile memory and the pillar comprises an active area of the plurality of selected memory cells; and
circuitry coupled with the plurality of memory cells, the circuitry, to perform an erase operation for each selected memory cell of the plurality of selected memory cells: pre-charges a channel of the channel by application of a pre-charge voltage to one end of the channel, then erases the selected memory cell by application of an erase voltage, higher than the pre-charge voltage, to the one end of the channel to charge the channel higher, and by configuration of a control gate voltage of the selected memory cell which encourage erase of the selected memory cell in an erase period, a timing of the erase period is based on a position of the selected memory cell in the channel.

18. The non-volatile memory device of claim 17, wherein:
the timing of the erase period comprises a start time and a duration of the erase period; and
for each selected memory cell of the plurality of selected memory cells, the start time and the duration of each erase period is based on the position of the selected memory cell in the channel.

19. The non-volatile memory device of claim 17, wherein:
the timing of the erase period comprises a start time of the erase period; and
for each selected memory cell of the plurality of selected memory cells, the start time is later when a distance along the channel of the selected memory cell from the one end of the channel is greater.

20. The non-volatile memory device of claim 17, wherein:
the timing of the erase period comprises a duration of the erase period; and
for each selected memory cell of the plurality of selected memory cells, the duration of the erase period is greater when a distance along the channel of the selected memory cell from the one end of the channel is greater.

21. The non-volatile memory device of claim 17, wherein: the application of the pre-charge voltage to the one end of the channel charges the channel by gate-induced drain leakage of a select gate at the one end of the channel.

22. The non-volatile memory device of claim 17, wherein: the control gate voltages which are configured to encourage erasing of the selected memory cells are at a voltage which is sufficiently low compared to a voltage in the channel to induce tunneling of holes from the channel into charge trapping regions of the plurality of selected memory cells.

23. The non-volatile memory device of claim 17, wherein: the circuitry, to configure the control gate voltages to encourage erasing, drives the control gate voltages lower from a floating or driven level to a reduced level.

24. The non-volatile memory device of claim 17, wherein: the circuitry is within the substrate.

25. The non-volatile memory device of claim 17, wherein: the circuitry is above the substrate.

26. A method for performing an erase operation, comprising:
pre-charging a channel of a plurality of selected memory cells, the pre-charging of the channel comprises applying a pre-charge voltage to one end of the channel, the plurality of selected memory cells are formed above a substrate in multiple physical levels of memory cells in a three-dimensional non-volatile memory, the channel is in a pillar which extends vertically in the three-dimensional non-volatile memory and the pillar comprises an active area of the plurality of selected memory cells; and
subsequently, applying an erase voltage, higher than the pre-charge voltage, to the one end of the channel to charge the channel higher while driving control gate voltages of the plurality of selected memory cells from a floating or driven level to a reduced level to encourage erasing of the plurality of selected memory cells in respective erase periods, and for each selected memory cell of the plurality of selected memory cells, at an end of the respective erase period, driving the control gate voltage higher from the reduced level to a level which discourages erasing of the plurality of selected memory cells, a timing of each erase period is based on a position of the selected memory cell in the channel.

27. The method of claim 26, wherein:
the control gate voltages which are configured to encourage erasing of the plurality of selected memory cells are at a voltage which is sufficiently low compared to a voltage in the channel to induce tunneling of holes from the channel into charge trapping regions of the plurality of selected memory cells.

28. The method of claim 26, wherein:
the level which discourages erasing of the plurality of selected memory cells is sufficiently high compared to a voltage in the channel to discourage tunneling of holes from the channel into charge trapping regions of the plurality of selected memory cells.

29. The method of claim 26, wherein:
the pre-charging and the applying of the erase voltage are performed by circuitry which is associated with operation of the plurality of selected memory cells and the circuitry is within the substrate.

30. The method of claim 26, wherein:
the pre-charging and the applying of the erase voltage are performed by circuitry which is associated with operation of the plurality of selected memory cells and the circuitry is above the substrate.

* * * * *